US008714459B2

(12) United States Patent
McCormack et al.

(10) Patent No.: US 8,714,459 B2
(45) Date of Patent: May 6, 2014

(54) SCALABLE HIGH-BANDWIDTH CONNECTIVITY

(75) Inventors: Gary D. McCormack, Tigard, OR (US); Ian A. Kyles, West Linn, OR (US)

(73) Assignee: WaveConnex, Inc., Mountain View, CA (US)

( * ) Notice: Subject to any disclaimer, the term of this patent is extended or adjusted under 35 U.S.C. 154(b) by 0 days.

(21) Appl. No.: 13/471,052

(22) Filed: May 14, 2012

(65) Prior Publication Data

US 2012/0286049 A1 Nov. 15, 2012

Related U.S. Application Data

(60) Provisional application No. 61/485,543, filed on May 12, 2011, provisional application No. 61/535,277, filed on Sep. 15, 2011, provisional application No. 61/549,378, filed on Oct. 20, 2011.

(51) Int. Cl.
*G06K 19/06* (2006.01)

(52) U.S. Cl.
USPC ........... 235/492; 257/531; 438/104; 438/107; 342/361

(58) Field of Classification Search
CPC ............... G06K 19/07749; G06K 19/0723; G06K 19/077; G07F 7/1008; G06Q 20/341; H01L 29/00
USPC .................... 235/492, 380; 257/778
See application file for complete search history.

(56) References Cited

U.S. PATENT DOCUMENTS

| | | |
|---|---|---|
| 3,796,831 A | 3/1974 | Bauer |
| 4,485,312 A | 11/1984 | Kusakabe et al. |
| 4,497,068 A | 1/1985 | Fischer |
| 4,694,504 A | 9/1987 | Porter et al. |
| 5,543,808 A | 8/1996 | Feigenbaum et al. |
| 5,621,913 A | 4/1997 | Tuttle et al. |
| 5,754,948 A | 5/1998 | Metze |
| 5,773,878 A | 6/1998 | Lim et al. |

(Continued)

FOREIGN PATENT DOCUMENTS

| | | |
|---|---|---|
| EP | 0 515 187 A2 | 11/1992 |
| EP | 1 298 809 A2 | 4/2003 |

(Continued)

OTHER PUBLICATIONS

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

(Continued)

*Primary Examiner* — Thien M Le
*Assistant Examiner* — Asifa Habib
(74) *Attorney, Agent, or Firm* — Kolisch Hartwell, P.C.

(57) ABSTRACT

A scalable, high-bandwidth connectivity architecture for portable storage devices and memory modules may utilize EHF communication link chip packages mounted in various two-dimensional and three-dimensional configurations on planar surfaces such as printed circuit boards. Multiple electromagnetic communication links between devices distributed on major faces of card-like devices may be provided with respectively aligned pairs of communication units on each device. Adjacent communication units on a printed circuit board may transmit or receive electromagnetic radiation having different polarization, such as linear or elliptical polarization. Power and communication between communication devices may both be provided wirelessly.

23 Claims, 14 Drawing Sheets

(56) References Cited

U.S. PATENT DOCUMENTS

| | | | |
|---|---|---|---|
| 5,956,626 | A | 9/1999 | Kaschke et al. |
| 6,351,237 | B1* | 2/2002 | Martek et al. ............... 342/361 |
| 6,490,443 | B1 | 12/2002 | Freeny, Jr. |
| 6,492,973 | B1 | 12/2002 | Kuroki et al. |
| 6,534,784 | B2 | 3/2003 | Eliasson et al. |
| 6,542,720 | B1 | 4/2003 | Tandy |
| 6,590,544 | B1 | 7/2003 | Filipovic |
| 6,607,136 | B1* | 8/2003 | Atsmon et al. ............... 235/492 |
| 6,718,163 | B2 | 4/2004 | Tandy |
| 6,915,529 | B1 | 7/2005 | Suematsu et al. |
| 6,967,347 | B2 | 11/2005 | Estes et al. |
| 7,107,019 | B2 | 9/2006 | Tandy |
| 7,213,766 | B2 | 5/2007 | Ryan et al. |
| 7,311,526 | B2 | 12/2007 | Rohrbach et al. |
| 7,512,395 | B2 | 3/2009 | Beukema et al. |
| 7,517,222 | B2 | 4/2009 | Rohrbach et al. |
| 7,593,708 | B2 | 9/2009 | Tandy |
| 7,598,923 | B2 | 10/2009 | Hardacker et al. |
| 7,599,427 | B2 | 10/2009 | Bik |
| 7,612,630 | B2 | 11/2009 | Miller |
| 7,617,342 | B2* | 11/2009 | Rofougaran ............... 710/100 |
| 7,645,143 | B2 | 1/2010 | Rohrbach et al. |
| 7,656,205 | B2 | 2/2010 | Chen et al. |
| 7,664,461 | B2 | 2/2010 | Rofougaran et al. |
| 7,760,045 | B2 | 7/2010 | Kawasaki |
| 7,761,092 | B2 | 7/2010 | Desch et al. |
| 7,768,457 | B2 | 8/2010 | Pettus et al. |
| 7,769,347 | B2 | 8/2010 | Louberg et al. |
| 7,778,621 | B2 | 8/2010 | Tandy |
| 7,791,167 | B1* | 9/2010 | Rofougaran ............... 257/531 |
| 7,820,990 | B2 | 10/2010 | Schroeder et al. |
| 7,889,022 | B2 | 2/2011 | Miller |
| 7,907,924 | B2 | 3/2011 | Kawasaki |
| 7,929,474 | B2 | 4/2011 | Pettus et al. |
| 8,014,416 | B2 | 9/2011 | Ho et al. |
| 8,036,629 | B2 | 10/2011 | Tandy |
| 8,041,227 | B2 | 10/2011 | Holcombe et al. |
| 8,063,769 | B2 | 11/2011 | Rofougaran |
| 8,081,699 | B2 | 12/2011 | Siwiak et al. |
| 8,087,939 | B2 | 1/2012 | Rohrbach et al. |
| 8,121,542 | B2 | 2/2012 | Zack et al. |
| 8,183,935 | B2 | 5/2012 | Milano et al. |
| 8,244,179 | B2 | 8/2012 | Dua |
| 8,279,611 | B2 | 10/2012 | Wong et al. |
| 8,339,258 | B2 | 12/2012 | Rofougaran |
| 2004/0214621 | A1 | 10/2004 | Ponce De Leon et al. |
| 2005/0140436 | A1 | 6/2005 | Ichitsubo et al. |
| 2006/0038168 | A1* | 2/2006 | Estes et al. ............... 257/25 |
| 2006/0159158 | A1 | 7/2006 | Moore et al. |
| 2007/0024504 | A1 | 2/2007 | Matsunaga |
| 2007/0063056 | A1 | 3/2007 | Gaucher et al. |
| 2007/0229270 | A1 | 10/2007 | Rofougaran |
| 2007/0278632 | A1 | 12/2007 | Zhao et al. |
| 2008/0089667 | A1 | 4/2008 | Grady et al. |
| 2008/0112101 | A1 | 5/2008 | McElwee et al. |
| 2008/0150799 | A1* | 6/2008 | Hemmi et al. ............... 342/361 |
| 2008/0150821 | A1 | 6/2008 | Koch et al. |
| 2008/0159243 | A1 | 7/2008 | Rofougaran |
| 2008/0192726 | A1 | 8/2008 | Mahesh et al. |
| 2008/0195788 | A1 | 8/2008 | Tamir et al. |
| 2008/0290959 | A1 | 11/2008 | Ali et al. |
| 2009/0006677 | A1 | 1/2009 | Rofougaran |
| 2009/0009337 | A1 | 1/2009 | Rofougaran |
| 2009/0037628 | A1 | 2/2009 | Rofougaran |
| 2009/0075688 | A1 | 3/2009 | Rofougaran |
| 2009/0094506 | A1 | 4/2009 | Lakkis |
| 2009/0175323 | A1 | 7/2009 | Chung |
| 2009/0218407 | A1* | 9/2009 | Rofougaran ............... 235/492 |
| 2009/0218701 | A1* | 9/2009 | Rofougaran ............... 257/778 |
| 2009/0236701 | A1 | 9/2009 | Sun et al. |
| 2009/0239392 | A1 | 9/2009 | Sumitomo et al. |
| 2009/0239483 | A1 | 9/2009 | Rofougaran |
| 2009/0245808 | A1 | 10/2009 | Rofougaran |
| 2009/0280765 | A1 | 11/2009 | Rofougaran et al. |
| 2010/0127804 | A1 | 5/2010 | Vouloumanos |
| 2010/0159829 | A1 | 6/2010 | McCormack |
| 2010/0202499 | A1 | 8/2010 | Lee et al. |
| 2010/0231452 | A1 | 9/2010 | Babakhani et al. |
| 2010/0277394 | A1 | 11/2010 | Haustein et al. |
| 2010/0283700 | A1 | 11/2010 | Rajanish et al. |
| 2010/0285634 | A1* | 11/2010 | Rofougaran ............... 438/107 |
| 2010/0297954 | A1 | 11/2010 | Rofougaran et al. |
| 2011/0047588 | A1 | 2/2011 | Takeuchi et al. |
| 2011/0181484 | A1 | 7/2011 | Pettus et al. |
| 2011/0207425 | A1 | 8/2011 | Juntunen et al. |
| 2011/0285606 | A1 | 11/2011 | De Graauw et al. |
| 2011/0286703 | A1 | 11/2011 | Kishima et al. |
| 2011/0311231 | A1 | 12/2011 | Ridgway et al. |
| 2012/0009880 | A1* | 1/2012 | Trainin et al. ............... 455/67.11 |
| 2012/0028582 | A1 | 2/2012 | Tandy |
| 2012/0064664 | A1* | 3/2012 | Yamazaki et al. ............ 438/104 |
| 2012/0069772 | A1 | 3/2012 | Byrne et al. |
| 2012/0083137 | A1 | 4/2012 | Rohrbach et al. |
| 2012/0263244 | A1 | 10/2012 | Kyles et al. |
| 2012/0290760 | A1 | 11/2012 | McCormack et al. |
| 2012/0295539 | A1 | 11/2012 | McCormack et al. |
| 2012/0307932 | A1 | 12/2012 | McCormack et al. |
| 2012/0319496 | A1 | 12/2012 | McCormack et al. |
| 2012/0319890 | A1 | 12/2012 | McCormack et al. |
| 2013/0070817 | A1 | 3/2013 | McCormack et al. |
| 2013/0106673 | A1 | 5/2013 | McCormack et al. |
| 2013/0109303 | A1 | 5/2013 | McCormack et al. |
| 2013/0157477 | A1 | 6/2013 | McCormack |
| 2013/0183903 | A1 | 7/2013 | McCormack et al. |

FOREIGN PATENT DOCUMENTS

| | | |
|---|---|---|
| EP | 2 309 608 A1 | 4/2011 |
| EP | 2 360 923 A1 | 8/2011 |
| WO | 2011/114737 A1 | 9/2011 |
| WO | 2011/114738 A1 | 9/2011 |
| WO | 2012/129426 A3 | 9/2012 |
| WO | 2012/166922 A1 | 12/2012 |
| WO | 2012/174350 A1 | 12/2012 |
| WO | 2013/006641 A3 | 1/2013 |
| WO | 2013/040396 A1 | 3/2013 |
| WO | 2013/059801 A1 | 4/2013 |
| WO | 2013/059802 A1 | 4/2013 |
| WO | 2013/090625 A1 | 6/2013 |

OTHER PUBLICATIONS

Márquez, T. López, Authorized Officer, European Patent Office, "International Search Report" in connection with related PCT Patent App. No. PCT/US2013/029469, dated Jun. 6, 2013, 5 pages.

Márquez, T. López, Authorized Officer, European Patent Office, "Written Opinion of the International Searching Authority" in connection with related PCT Patent App. No. PCT/US2013/029469, dated Jun. 6, 2013, 5 pages.

Jochen Helms, Authorized Officer, European Patent Office, "International Search Report" in connection with related PCT Patent App. No. PCT/US2013/023665, dated Jun. 20, 2013, 5 pages.

Jochen Helms, Authorized Officer, European Patent Office, "Written Opinion of the International Searching Authority" in connection with related PCT Patent App. No. PCT/US2013/023665, dated Jun. 20, 2013, 10 pages.

Office of Engineering and Technology Federal Communications Commission, "Understanding the FCC Regulations for Low-Power, Non-Licensed Transmitters", OET Bulletin No. 63, Oct. 1993, 34 pages.

Vahle Electrification Systems, "CPS Contactless Power System", Catalog No. 9d/E, 2004, 12 pages.

Eric A. Juntunen, "60 GHz CMOS Pico-Joule/Bit Oook Receiver Design for Multi-Gigabit Per Second Wireless Communications" thesis paper, Aug. 2008, 52 pages.

Murcia Martinez, J., Authorized Officer, European Patent Office, "International Search Report" in connection with related Application Serial No. PCT/US2012/040214, dated Aug. 21, 2012, 3 pages.

Murcia Martinez, J., Authorized Officer, European Patent Office, "Written Opinion of the International Searching Authority" in connection with related Application Serial No. PCT/US2012/040214, dated Aug. 21, 2012, 8 pages.

(56) References Cited

OTHER PUBLICATIONS

Ablerga, Vito, Authorized Officer, European Patent Office, "International Search Report" in connection with related Application Serial No. PCT/US2012/042616,, dated Oct. 1, 2012, 4 pages.
Ablerga, Vito, Authorized Officer, European Patent Office, "Written Opinion of the International Searching Authority" in connection with related Application Serial No. PCT/US2012/042616,, dated Oct. 1, 2012, 10 pages.
Cortes Rosa, Joao, Authorized Officer, European Patent Office, "International Search Report" in connection with related Application No. PCT/US2012/030166, dated Oct. 31, 2010, 6 pages.
Cortes Rosa, Joao, Authorized Officer, European Patent Office, "Written Opinion of the International Searching Authority" in connection with related Application No. PCT/US2012/030166, dated Oct. 31, 2010, 9 pages.
Helms, Jochen, Authorized Officer, European Patent Office, "International Search Report" in connection with related Application No. PCT/US2012/055488, dated Dec. 13, 2012, 4 pages.
Helms, Jochen, Authorized Officer, European Patent Office, "Written Opinion of the International Searching Authority" in connection with related Application No. PCT/US2012/055488, dated Dec. 13, 2012, 8 pages.
Helms, Jochen, Authorized Officer, European Patent Office, "International Search Report" in connection with related Application No. PCT/US2012/045444, dated Jan. 21, 2013, 7 pages.
Helms, Jochen, Authorized Officer, European Patent Office, "Written Opinion of the International Searching Authority" in connection with related Application No. PCT/US2012/045444, dated Jan. 21, 2013, 9 pages.
Helms, Jochen, Authorized Officer, European Patent Office, "International Search Report" in connection with related Application No. PCT/US2012/037795, dated Jan. 21, 2013, 7 pages.
Helms, Jochen, Authorized Officer, European Patent Office, "Written Opinion of the International Searching Authority" in connection with related Application No. PCT/US2012/037795, dated Jan. 21, 2013, 12 pages.
Helms, Jochen, Authorized Officer, European Patent Office, "International Search Report" in connection with related Application No. PCT/US2012/061345, dated Jan. 24, 2013, 4 pages.
Helms, Jochen, Authorized Officer, European Patent Office, "Written Opinion of the International Searching Authority" in connection with related Application No. PCT/US2012/061345, dated Jan. 24, 2013, 7 pages.
Franz, Volker, Authorized Officer, European Patent Office, "International Search Report" in connection with related Application No. PCT/US2012/061346, dated Jan. 24, 2013, 5 pages.
Franz, Volker, Authorized Officer, European Patent Office, "International Search Report" in connection with related Application No. PCT/US2012/061346, dated Jan. 24, 2013, 9 pages.
Franz, Volker, Authorized Officer, European Patent Office, "Written Opinion of the International Searching Authority" in connection with related Application No. PCT/US2012/061346, dated Jan. 24, 2013, 9 pages.
Bouhana, Emmanuel, Authorized Officer, European Patent Office, "International Search Report" in connection with related Application No. PCT/US2012/069576, dated May 2, 2013, 3 pages.
Bouhana, Emmanuel, Authorized Officer, European Patent Office, "Written Opinion of the International Searching Authority" in connection with related Application No. PCT/US2012/069576, dated May 2, 2013, 13 pages.
Young, Lee W., Authorized Officer, U.S. Receiving Office, "Written Opinion of the International Searching Authority" in connection with related Application No. PCT/US2013/027835, May 3, 2013, 4 pages.
Young, Lee W., Authorized Officer, U.S. Receiving Office, "International Search Report" in connection with related Application No. PCT/US2013/027835, May 3, 2013, 4 pages.

* cited by examiner

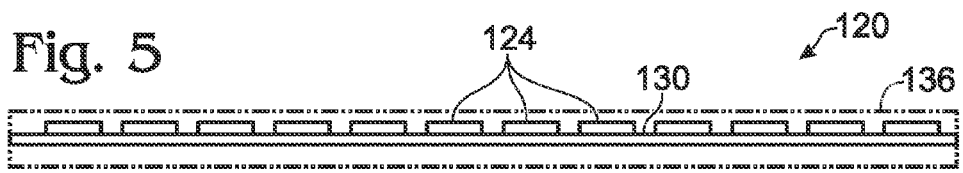
Fig. 5
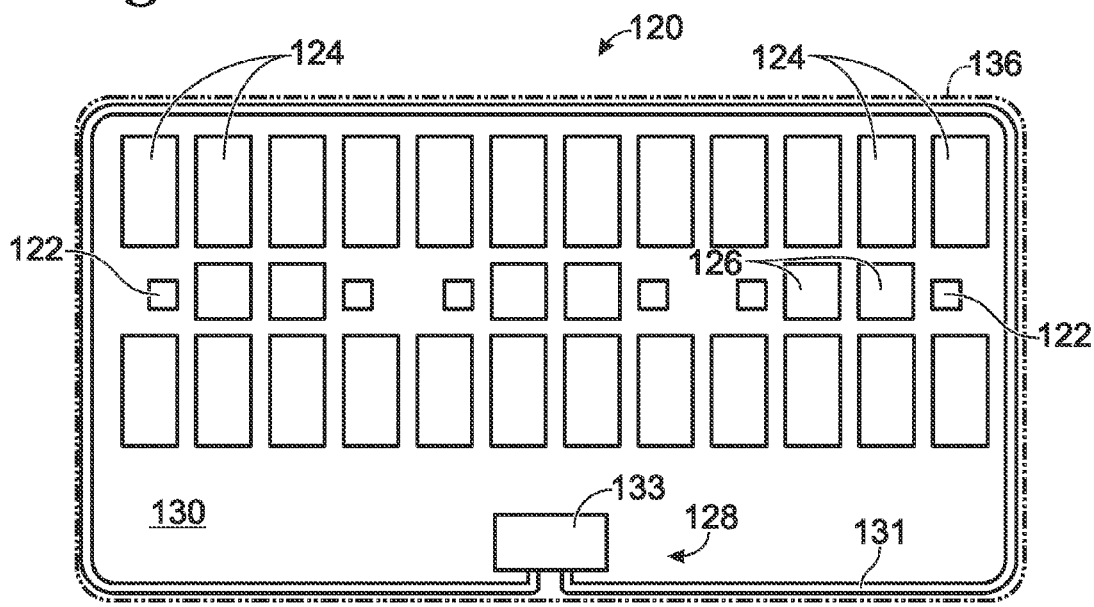
Fig. 6
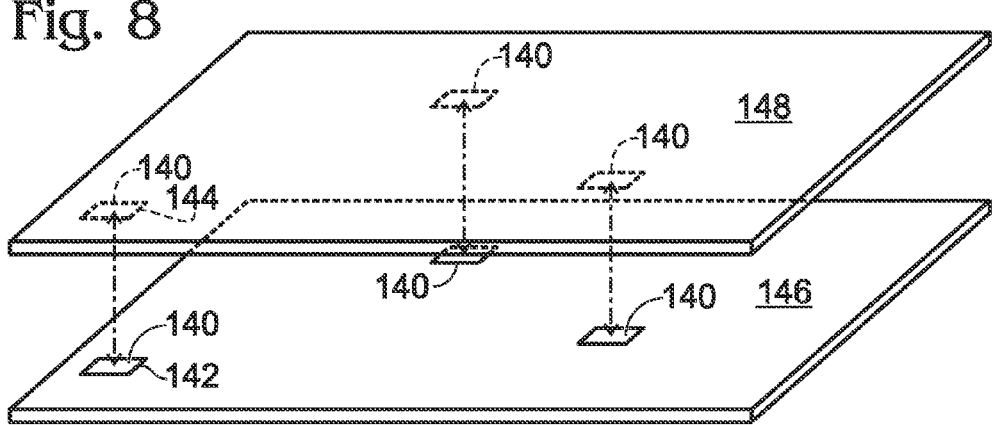
Fig. 8
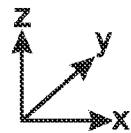

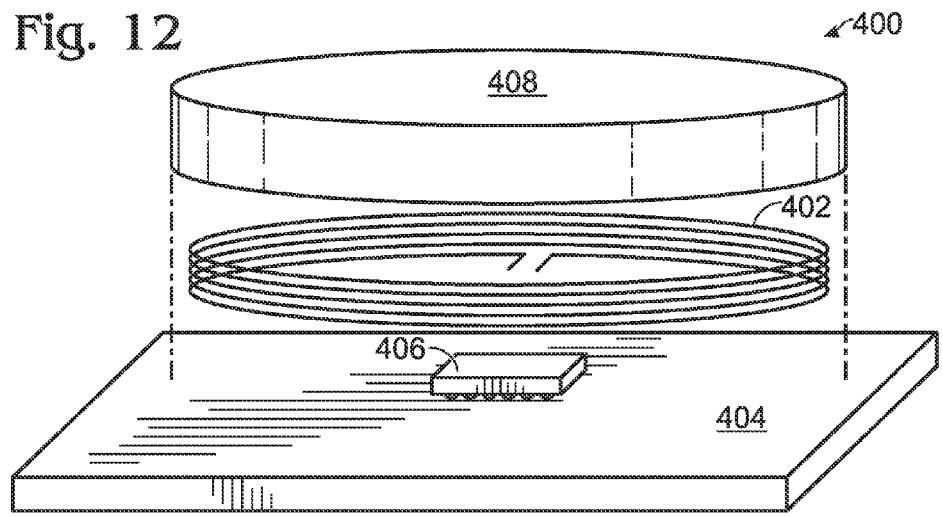
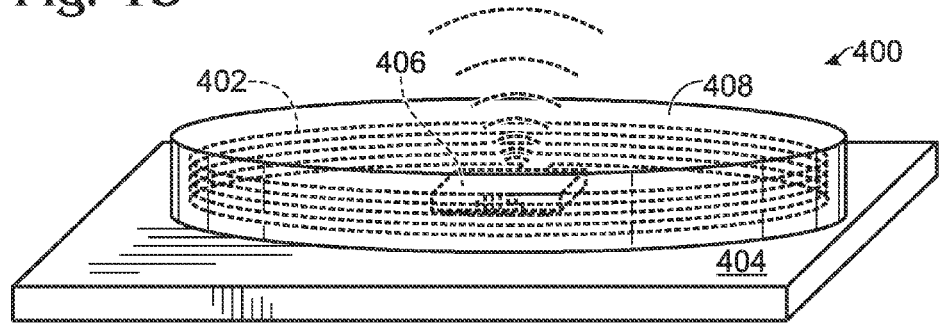
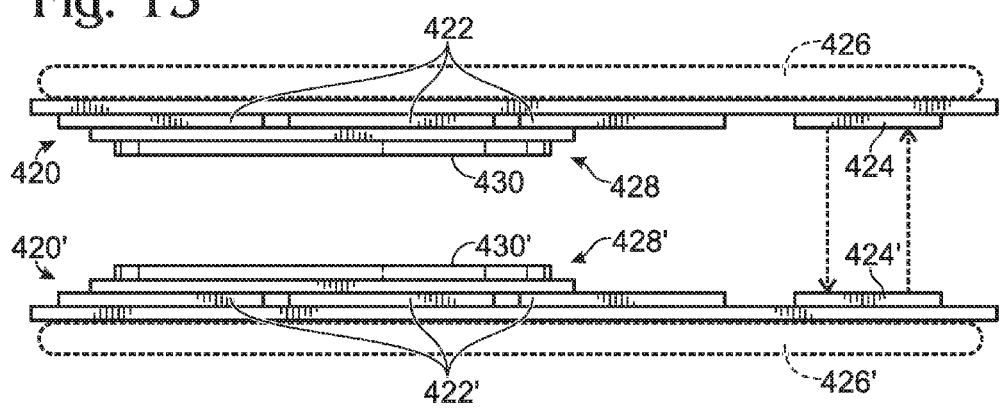

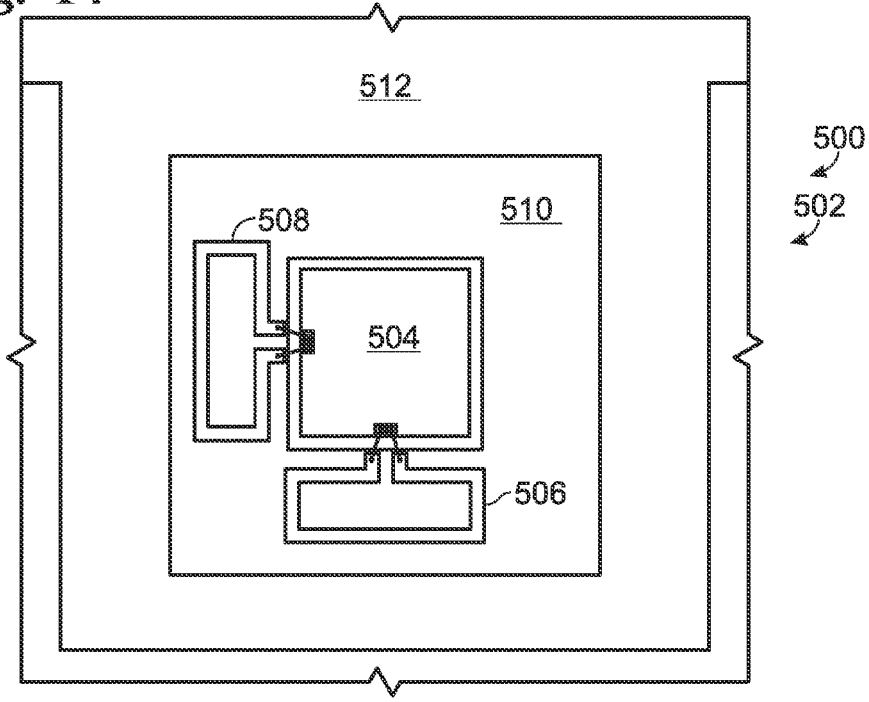
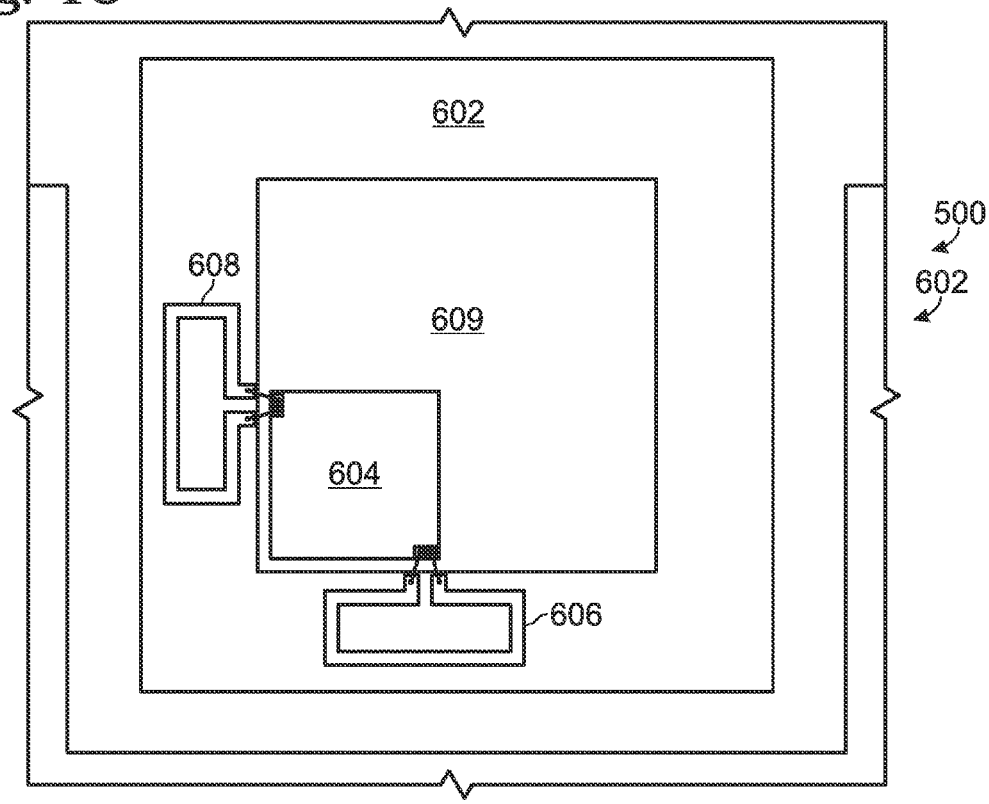

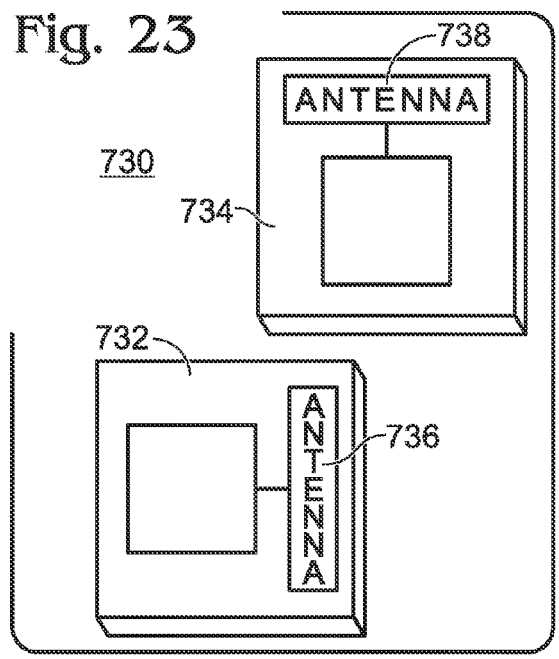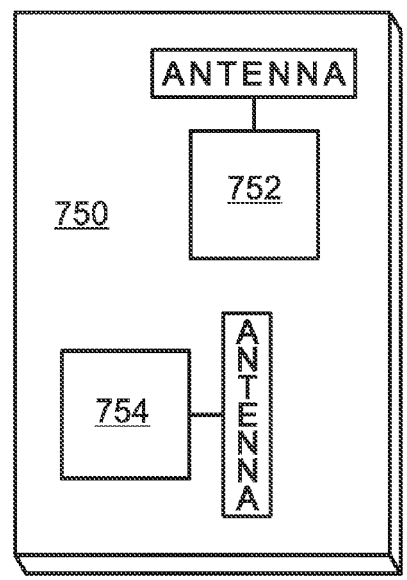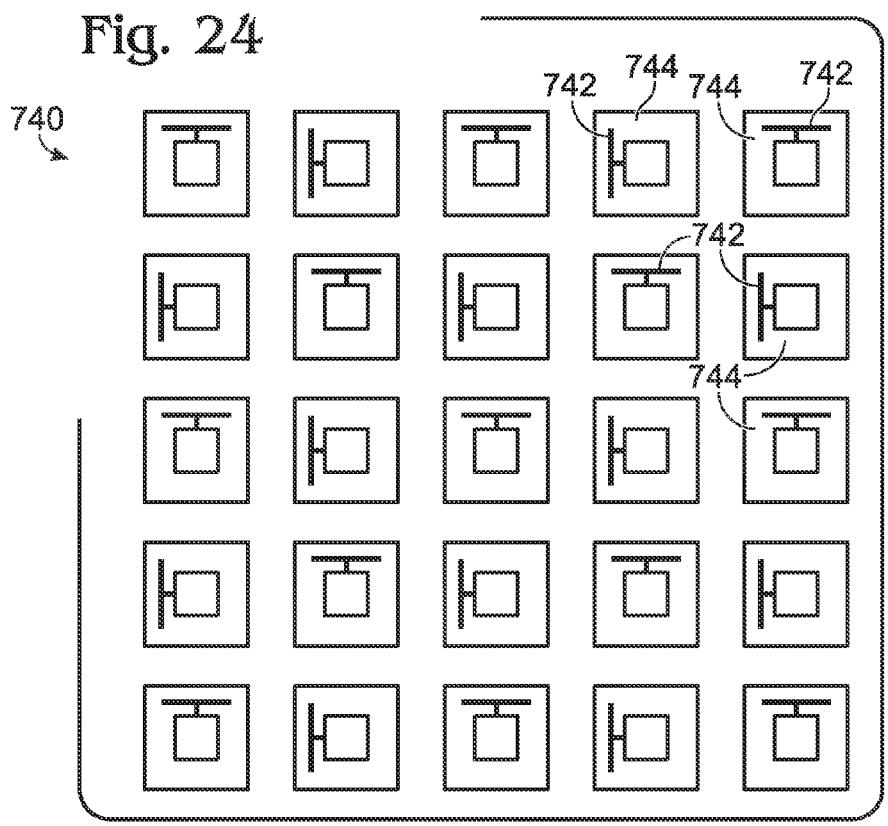

SCALABLE HIGH-BANDWIDTH CONNECTIVITY

CROSS-REFERENCE TO RELATED APPLICATIONS

This application claims the benefit of the following U.S. Provisional patent applications: (i) Ser. No. 61/485,543, filed on May 12, 2011 and entitled "Scalable High-Bandwidth Connectivity Method and Apparatus"; (ii) Ser. No. 61/535,277, filed on Sep. 15, 2011 and entitled "Wireless Power And Data Transfer System"; and (iii) Ser. No. 61/549,378, filed on Oct. 20, 2011 and entitled "Zero Height Connectors"; which applications are incorporated herein by reference in their entirety for all purposes.

FIELD OF THE DISCLOSURE

This disclosure relates to systems and methods for EHF communications, including communication associated with modular and portable memory devices.

BACKGROUND OF THE DISCLOSURE

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

SUMMARY OF THE DISCLOSURE

In one example, an electronic storage device may include a dielectric client substrate, a first data storage unit mounted to the client substrate for storing digital information, and a first client EHF communication unit having a first antenna. The first client communication unit mounted to the client substrate may be in communication with the first data storage unit. This may facilitate converting between an EHF electromagnetic signal containing digital information conducted by the first antenna and a data signal conducted by the first data-storage circuit.

In another example, an IC package assembly may have first, second, and intermediate dielectric substrate portions. A first EHF comm-link chip may be mounted to the first dielectric substrate portion, with a first antenna mounted to the first dielectric substrate portion and operatively coupled to the first EHF comm-link chip. A second EHF comm-link chip may be mounted to the second dielectric substrate portion, and a second antenna mounted to the second substrate portion and operatively coupled to the second EHF comm-link chip. The first EHF comm-link chip and the first antenna may be configured as a transmitter. The second EHF comm-link chip and the second antenna may be configured as a receiver. The second antenna may be disposed relative to the first antenna to receive radiation transmitted by the first antenna. The intermediate dielectric substrate portion may extend between the first and second antennas.

In another example, a data device for electromagnetic communication with a host may include at least one data storage unit and at least one EHF communication unit in communication with the at least one data storage unit. The EHF communication unit may be constructed to communicate with the host via electromagnetic communication. The at least one data storage unit and the at least one EHF communication unit may be coupled to an expanse.

In a further example, a data card for electromagnetic communication with a host may comprise a card body that includes an outer surface and an internal expanse. The internal expanse may include plural data storage units. The body may accommodate communication with the host via electromagnetic communication.

Advantages of such systems and methods will be more readily understood after considering the drawings and the Detailed Description.

BRIEF DESCRIPTION OF THE DRAWINGS

FIG. 5 shows a side view of an illustrative portable storage card.

FIG. 6 shows a plan view of the portable storage card of FIG. 5.

FIG. 8 shows an isometric view of two illustrative boards with various illustrative IC packages mounted thereon for communication between the boards.

FIG. 12 shows an exploded view of an illustrative arrangement of an IC package and primary coil portion of an illustrative docking device.

FIG. 13 shows an assembled view of the docking device of FIG. 12.

FIG. 15 is a side view of two illustrative portable data storage devices in a docking alignment.

FIG. 17 is an overhead view of an illustrative IC package with multiple antennas.

FIG. 18 is an overhead block diagram of an illustrative IC package with multiple antennas arranged in a corner configuration.

FIG. 23 shows an illustrative arrangement of multiple single-antenna IC packages.

FIG. 24 shows an illustrative array of multiple single-antenna IC packages.

FIGS. 25-27 show illustrative arrangements of multiple single-antenna chips in a single package.

DETAILED DESCRIPTION OF THE DISCLOSURE

Figure 1:
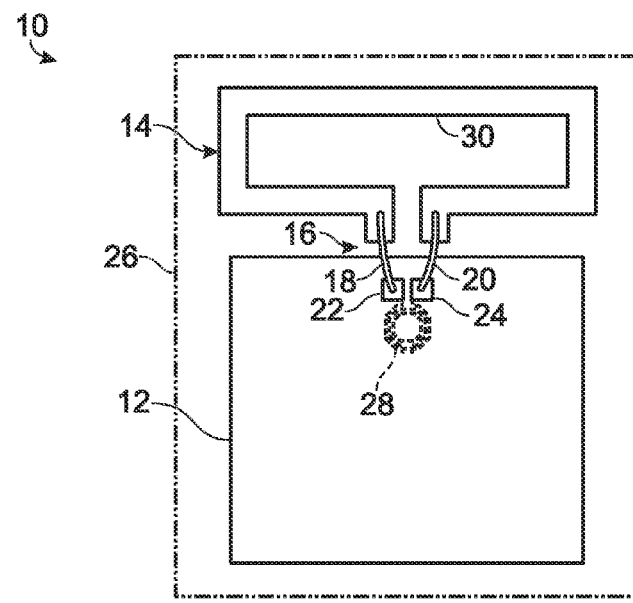
FIG. 1 shows a simplified schematic overhead view of a first example of an integrated circuit (IC) package including a die and antenna.

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may be discontiguous with respect to each other. In some examples, the transmitter and receiver may be disposed on separate circuit carriers positioned with the antennas of the transmitter/receiver pair in close proximity.

As discussed below, a transmitter and/or receiver may be configured as an IC package, in which one or more antennas may be positioned adjacent to a die and held in place by a dielectric or insulating encapsulation or bond material. An antenna may also be held in place by a lead frame substrate. Examples of EHF antennas embedded in IC packages are shown in the drawings and described below. Note that IC packages may also be referred to as EHF IC packages or simply packages, and are examples of wireless communication units that are also variously referred to as EHF communication units, communication units, communication devices, comm-link chip packages, and/or comm-link packages.

FIG. 1 shows an exemplary IC package, generally indicated at 10. IC package 10 includes a chip or die 12, a transducer 14 providing conversion between electrical and electromagnetic (EM) signals, and conductive connectors 16, such as bond wires 18, 20 electrically connecting the transducer to bond pads 22, 24 connected to a transmitter or receiver circuit included in die 12. IC package 10 further includes an encapsulating material 26 formed around at least a portion of the die and/or the transducer. In this example encapsulating material 26 covers die 12, conductive connectors 16, and transducer 14, and is shown in phantom lines so that details of the die and transducer may be illustrated in solid lines.

Die 12 includes any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. Die 12 may have a length and a width dimension, each of which may be about 1.0 mm to about 2.0 mm, and preferably about 1.2 mm to about 1.5 mm. Die 12 may be mounted with further electrical conductors 16, such as a lead frame, not shown in FIG. 1, providing connection to external circuits. A transformer 28, shown in dashed lines, may provide impedance matching between a circuit on die 12 and transducer 14.

Transducer 14 may be in the form of a folded dipole or loop antenna 30, may be configured to operate at radio frequencies such as in the EHF spectrum, and may be configured to transmit and/or receive electromagnetic signals. Antenna 30 is separate from but operatively connected to die 12 by suitable conductors 16, and is located adjacent to die 12.

The dimensions of antenna 30 are suitable for operation in the EHF band of the electromagnetic frequency spectrum. In one example, a loop configuration of antenna 30 includes a 0.1 mm band of material, laid out in a loop 1.4 mm long and 0.53 mm wide, with a gap of 0.1 mm at the mouth of the loop, and with the edge of the loop approximately 0.2 mm from the edge of die 12.

Encapsulating material 26 is used to assist in holding the various components of IC package 10 in fixed relative positions. Encapsulating material 26 may be any suitable material configured to provide electrical insulation and physical protection for the electrical and electronic components of IC package 10. For example, encapsulating material 26, also referred to as insulating material, may be a mold compound, glass, plastic, or ceramic. Encapsulating material 26 may also be formed in any suitable shape. For example, encapsulating material 26 may be in the form of a rectangular block, encapsulating all components of IC package 10 except the unconnected ends of conductors 16 connecting the die to external circuits. External connections may be formed with other circuits or components.

Figure 2:
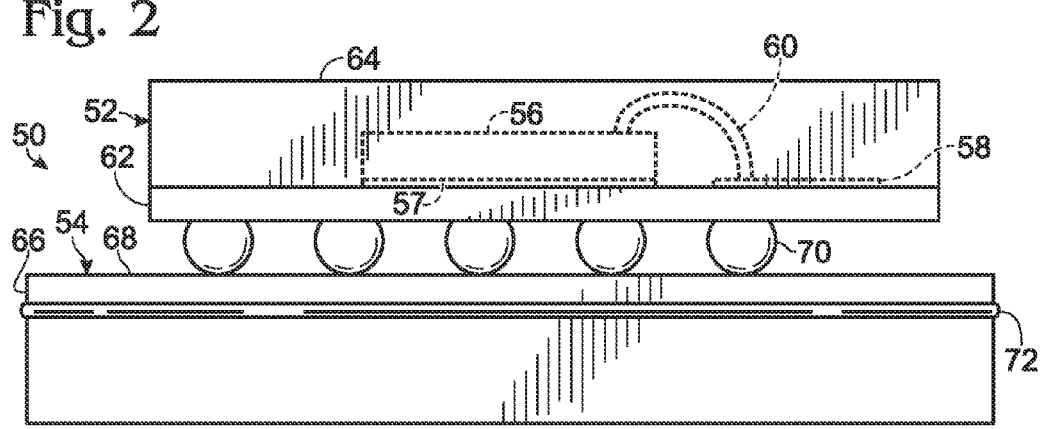
FIG. 2 shows a schematic side view of an exemplary communication device including an IC package and printed circuit board (PCB).

FIG. 2 shows a representational side view of a communication device 50 including an IC package 52 flip-mounted to an exemplary printed circuit board (PCB) 54. In this example, it may be seen that IC package 52 includes a die 56, a ground plane 57, an antenna 58, bond wires, including bond wire 60, connecting the die to the antenna. The die, antenna, and bond wires are mounted on a package substrate 62 and encapsulated in encapsulating material 64. Ground plane 57 may be mounted to a lower surface of die 56, and may be any suitable structure configured to provide an electrical ground for the die. PCB 54 may include a top dielectric layer 66 having a major face or surface 68. IC package 52 is flip-mounted to surface 68 with flip-mounting bumps 70 attached to a metallization pattern (not shown).

PCB 54 may further include a layer 72 spaced from surface 68 made of conductive material forming a ground plane within PCB 54. The PCB ground plane may be any suitable structure configured to provide an electrical ground to circuits and components on PCB 54.

Figure 3:
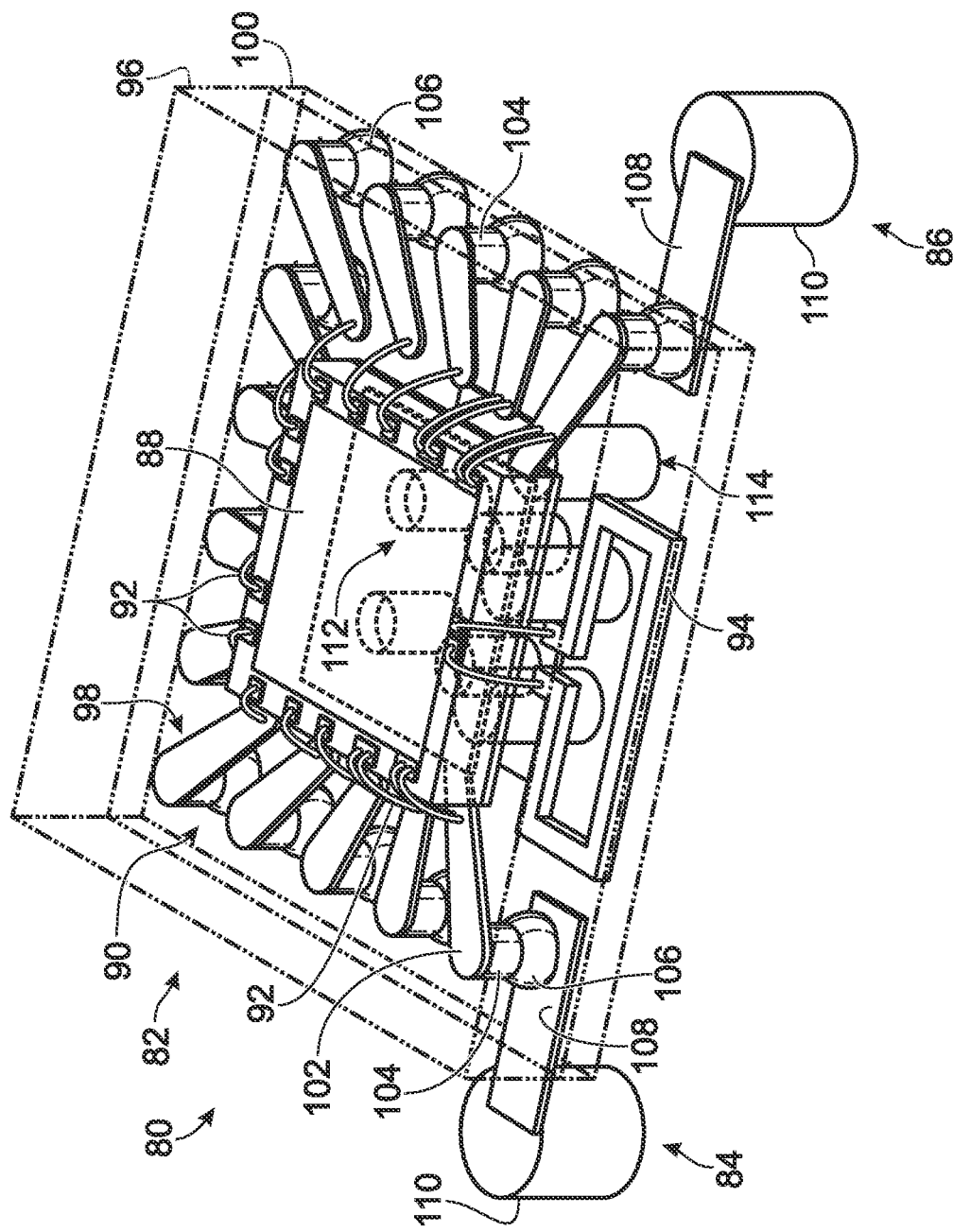
FIG. 3 shows an isometric view of another exemplary communication device including an IC package with external circuit conductors.
Figure 4:
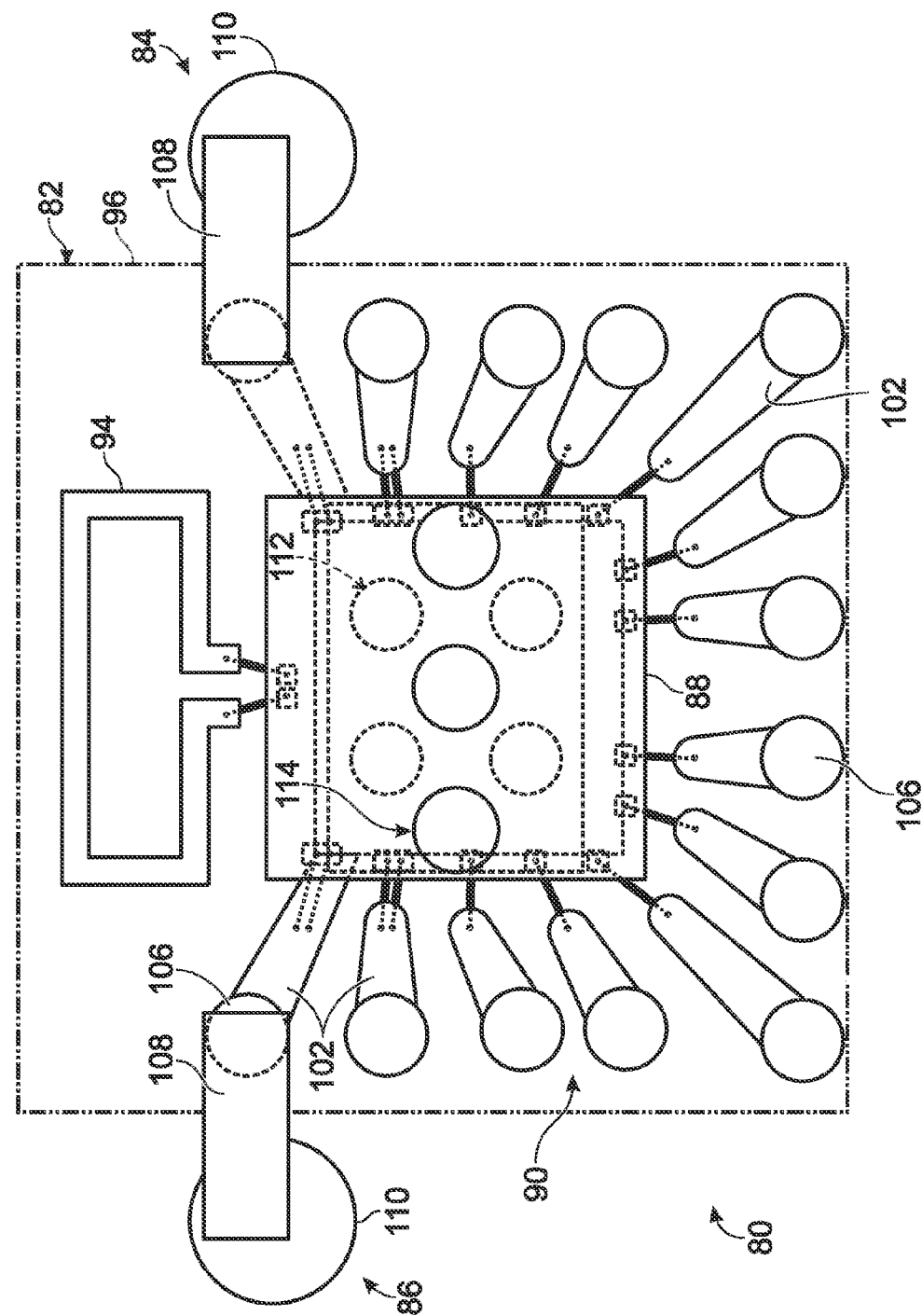
FIG. 4 shows a bottom view of the exemplary communication device of FIG. 3.

FIGS. 3 and 4 illustrate another exemplary communication device 80 including an IC package 82 with external circuit conductors 84 and 86. In this example, IC package 82 may include a die 88, a lead frame 90, conductive connectors 92 in the form of bond wires, an antenna 94, encapsulating material 96, and other components not shown to simplify the illustration. Die 88 may be mounted in electrical communication with lead frame 90, which may be any suitable arrangement of electrical conductors or leads 98 configured to allow one or more other circuits to operatively connect with die 90. Antenna 94 may be constructed as a part of the manufacturing process that produces lead frame 90.

Leads 98 may be embedded or fixed in a lead frame substrate 100, shown in phantom lines, corresponding to package substrate 62. The lead frame substrate may be any suitable insulating material configured to substantially hold leads 98 in a predetermined arrangement. Electrical communication between die 88 and leads 98 of lead frame 90 may be accomplished by any suitable method using conductive connectors 92. As mentioned, conductive connectors 92 may include bond wires that electrically connect terminals on a circuit of die 88 with corresponding lead conductors 98. For example, a conductor or lead 98 may include a plated lead 102 formed on an upper surface of lead frame substrate 100, a via 104 extending through the substrate, a flip-mounting bump 106 mounting IC package 82 to a circuit on a base substrate, such as a PCB, not shown. The circuit on the base substrate may include a external conductors, such as external conductor 84, which for example, may include a strip conductor 108 connecting bump 106 to a further via 110 extending through the base substrate. Other vias 112 may extend through the lead frame substrate 100 and there may be additional vias 114 extending through the base substrate.

In another example, die 88 may be inverted and conductive connectors 92 may include bumps, or die solder balls, as described previously, which may be configured to electrically connect points on a circuit of die 88 directly to corresponding leads 98 in what is commonly known as a "flip chip" arrangement.

A first and a second IC package 10 may be co-located on a single PCB and may provide intra-PCB communication. In other examples, a first IC package 10 may be located on a first PCB and a second IC package 10 may be located on a second PCB and may therefore provide inter-PCB communication. One such PCB may be part of a data storage device, which includes any device that has data storage capability. A data storage device may also be portable.

For example, FIGS. 5 and 6 show an illustrative wallet card-sized portable storage device 120, which may include multiple examples of IC package 10 such as IC packages 122, memory chips 124, controller chips 126, and/or power source 128 all mounted in a preselected array on a dielectric substrate or expanse 130 within portable storage device 120.

A data storage device (such as portable storage device 120) may include a data storage unit, which in turn may include one or more memory devices such as are embodied in memory chip 124, and may include associated memory support circuitry, such as a controller embodied in a controller chip 126. Components such as memory chips 124, controller chips 126, and inductive or contactless power source 128 may be conventional components of the kind typically found in "smart cards" and the like. Wireless communication circuits, such as IC packages 122, may be disposed alongside and in electrical communication with these components and configured to provide communication between the various components. In other examples, the chips of IC packages 122 may be embedded within memory chips 124 and/or controller chips 126, such as being mounted within the packaging of those components. Each memory chip may be associated with a respective one of the communication circuits, and there may be communication circuits not associated with a memory chip, as is appropriate for a particular application. Power source 128 may include, for example an inductive coil 131 and a power interface circuit 133.

Figure 7:
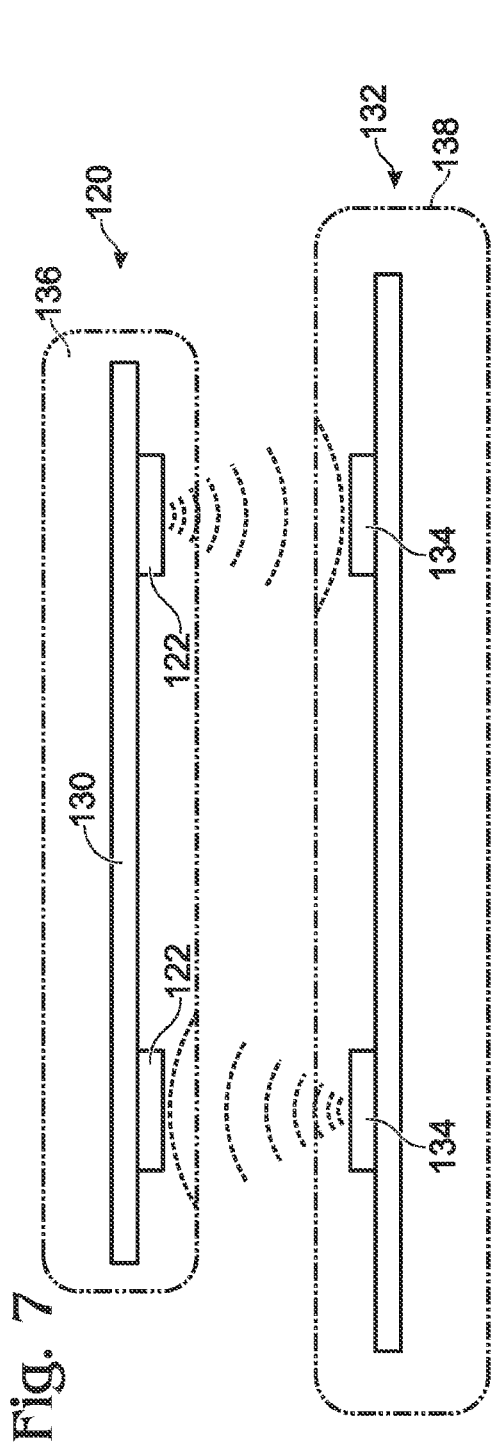
FIG. 7 shows an illustrative arrangement of a portable device containing IC packages in EHF communication with a host device containing corresponding IC packages.

Dielectric substrate or expanse 130 may have a major surface and multiple edges forming a perimeter. The multiple IC packages 122 may be spaced around and from the perimeter of dielectric substrate or expanse 130, and may be configured to provide communication between components on the card, such as between memory chips 124. IC packages 122 may also be configured to provide communication between portable storage device 120 and a host device 132 configured with one or more corresponding IC packages 134, as shown in FIG. 7. A portable storage device may also be referred to as a client device, especially in relation to a host device. Host and client may communicate best in a certain mutual configuration, such as by placing the devices with major surfaces of the client and host facing each other with the wireless communication devices in suitable alignment to effect intercommunication.

A covering 136 may be used to seal and/or encase the components of a data storage device or card 120. Covering 136 may accommodate electromagnetic (EM) communication by being made of a dielectric material or other material substantially transparent to EM radiation in the EHF range. Similarly, a covering 138 may cover components of a host device 132.

Host devices 132 are any devices having a transducer capable of communicating with one or more IC packages 122 on a data storage device (such as device 120), and may include devices such as a personal computer, phone, camera, ATM, or electronic point of sale device (not pictured). In this manner, high-bandwidth EHF communications may be achieved within a sealed, rugged device and high-rate data transfer may be accomplished with a host machine via a zero-insertion force, non-corroding, non-wearing interface. Furthermore, relaxed alignment tolerances and improved signal integrity at smaller sizes provide improved manufacturability and portability.

Figure 9:
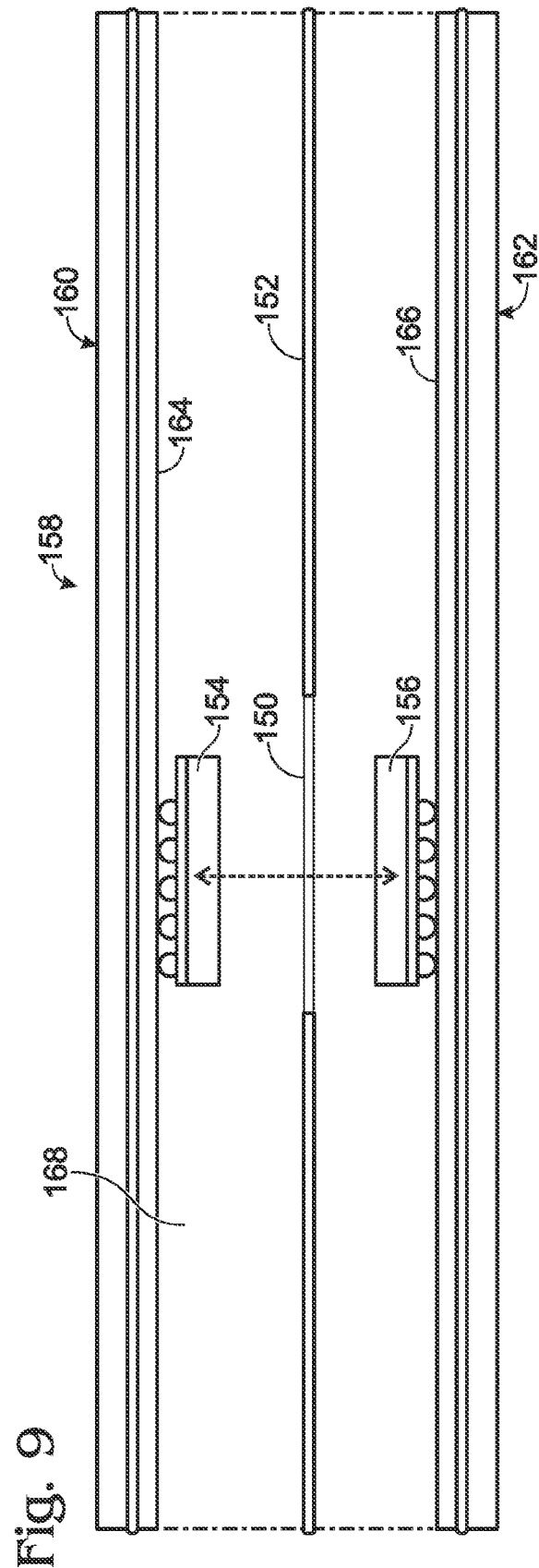
FIG. 9 shows a side view of two illustrative mounted IC packages arranged to communicate through a non-metalized window in an intervening planar structure.

FIGS. 8 and 9 illustrate a high-bandwidth scalable architecture for portable storage devices and memory modules using multiple communication IC packages mounted on a plurality of PCBs. In some examples, IC packages 140 may be configured to communicate directionally or hemispherically. A pair of IC packages, such as IC packages 142 and 144, may be disposed facing each other on separate PCBs, such as on PCB 146 and PCB 148 shown in FIG. 8. IC package 142 may be configured to radiate or receive EHF signals in the direction of IC package 144, and/or vice versa, thereby providing a link to allow EHF communication between IC package 142 and IC package 144.

Using a stacked-PCB configuration with IC packages communicating between stack "layers" in this fashion provides a scalable architecture which allows significant communication and capacity growth without changing the footprint of a device. Multiple layers having inter-layer communication may be provided. It may also be observed that, due to the relatively broad radiation pattern transmitted by an IC package, PCBs 146 and 148 can be misaligned to some extent on the X, Y, and/or Z axis without substantially affecting a communication link between IC packages.

In some examples, a related method and configuration may be used to provide architectural flexibility as shown in FIG. 9. Because paired IC packages do not require physical connection to effect communication, one or more non-conductive windows 150 may be configured in an intervening layer, such as conductive layer 152, to allow communication between IC packages, such as IC packages 154 and 156, on nonadjacent layers of a communication assembly 158. Window 150 may be configured as a hole or gap in intervening layer 152. In other examples, because dielectric material is essentially transparent to EHF radiation, window 150 may be configured as an area in layer 152 that is free of metal components but does still contain materials such as dielectric lamination layers. This method of construction allows improved scalability and flexibility in designing stacked device architectures. It will be appreciated that the assembly may comprise separate devices 160 and 162 containing IC packages 154 and 156 mounted to respective PCBs 164 and 166. As a further example, layer 152 may be a part of either of PCBs 164 and 166. In yet a further example, layer 152 and IC packages 154 and 156 may be mounted in a single PCB assembly 168.

A wireless docking system incorporating the previously discussed IC packages will now be described. A wireless docking system may enable connector-free docking of a portable device on a base station, and may provide simultaneous wireless data transfer and wireless charging.

Figure 10:
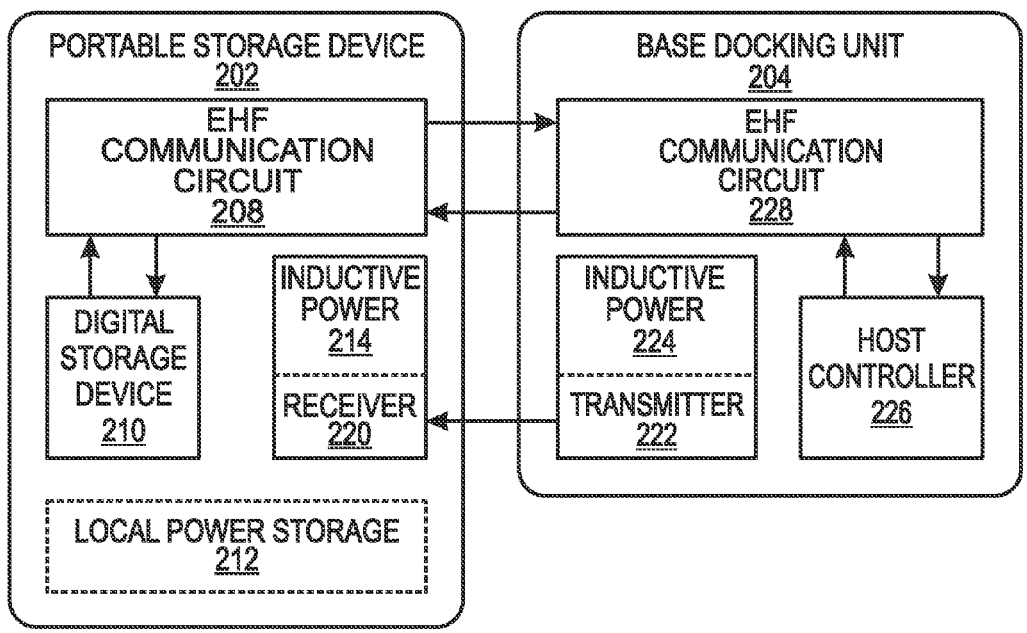
FIG. 10 is a block diagram describing an illustrative two-device wireless docking system.

FIG. 10 is a block diagram depicting an example of a wireless docking system 200. Wireless docking system 200 may include a portable device 202 and a base unit 204. Portable device 202 may be any device configured to be powered wirelessly using an inductive power system and also to communicate wirelessly using one or more wireless communication units, such as IC packages. Portable device 202 may include an EHF communication circuit 208, a data storage unit 210, a local power storage device 212, and/or an inductive power receiver 214. The components of portable device 202 may be contained in a case (not pictured). A portable device 202 may also be a portable media device, which may, for example, take the form of a cellular phone, personal digital assistant (PDA), MP3 player, notebook computer, or tablet.

EHF communication circuit 208 may be any circuit configured to communicate wirelessly using one or more IC packages or communication units. For example, EHF communication circuit 208 may include two IC packages, one configured as a transmitter and the other configured as a receiver. These IC packages may be configured to communicate with other IC packages in other devices rather than with other such packages in the same device.

EHF communication circuit 208 may be in electrical communication with digital data storage unit 210. Data storage unit 210 may be any suitable data storage unit capable of reading and writing data. For example, data storage unit 210 may be an IC chip, card, disk, or solid-state drive (SSD). In typical operation, EHF communication circuit 208 may function to transfer data between data storage unit 210 and an external device.

EHF communication circuit 208 may also receive power from local power storage device 212. Power storage device 212 may be any suitable device configured to store electrical energy for future use. For example, power storage device 212 may be a lithium ion battery, a fuel cell, a capacitor such as an ultracapacitor, or any other battery-like device that may be charged and discharged.

Inductive power receiver 214 may be in electrical communication with local power storage device 212 and may function to charge power storage device 212. Inductive power receiver 214 may be any suitable device capable of receiving wireless energy transfer from a power source. For example, inductive power receiver 214 may include a secondary coil 220 in which a current may be induced by a primary coil 222 located in a separate charging device such as base unit 204. Worldwide open standards for this sort of inductive charging have been developed. For example the "Qi" standard developed by the Wireless Power Consortium has begun to be utilized in commercial products.

Base unit 204 may be any suitable device configured to wirelessly communicate with portable device 202 and to wirelessly provide power to portable device 202. For example, base unit 204 may include a housing that encloses an inductive power source 224, a host controller 226, and/or an EHF communications circuit 228. Note that in some examples, at least some roles of the two devices may be reversed. Accordingly, host controller 226 may be located in portable device 202 and base unit 204 may include a storage unit such as storage unit 210. In other embodiments, both devices may include an example of a host controller 226 and/or a storage unit 210, enabling functionality such as device-to-device data copying.

Inductive power source 224 may be any suitable device configured to provide electrical power wirelessly to inductive power receiver 214. As described above, inductive power source 224 may include primary coil 222.

Host controller 226 may be any suitable device or component configured to control the electronic activity of the overall wireless docking system 200. For example, host controller 226 may be a personal computing device configured via software and/or firmware to coordinate synchronization of data between portable device 202 and a personal computer. In other examples, host controller 226 may include any or all of the following: a video player; audio player; security system; display system; music, video, and/or audiobook organizer; data back-up storage system; portable phone manager; etc.

As mentioned before, host controller 226 may be included in portable device 202 rather than base unit 204. For example, portable device 202 may control a transaction wherein a video playing or available on portable device 202 may appear on a base unit 204 that comprises a large screen video display. This transaction may be controlled entirely from the portable device.

Base unit 204 may also include EHF communications circuit 228, which may include one or more IC packages or other communications units configured to transfer information to and from the IC packages in portable device 202. For each IC package configured as a transmitter in portable device 202, a corresponding IC package configured as a receiver may be provided in base unit 204. In similar fashion, a receiver in portable device 202 may have a corresponding transmitter in base unit 204. To facilitate data transfer, the resulting transmitter-receiver pairs may be disposed such that proper general alignment of the devices also aligns all transmitter-receiver pairs.

Alternatively, some transmitter-receiver pairs may be aligned when the portable device and base station are placed in a first configuration while others may be aligned when the two devices are placed in a second configuration. For example, a base unit 204 may provide two sets of markings on an interface surface. One set of markings may indicate where to place portable device 202 to enable data synchronization, while the other may indicate where to place portable device 202 to enable music playback or some other functionality, and both positions may allow simultaneous battery charging.

Figure 11:
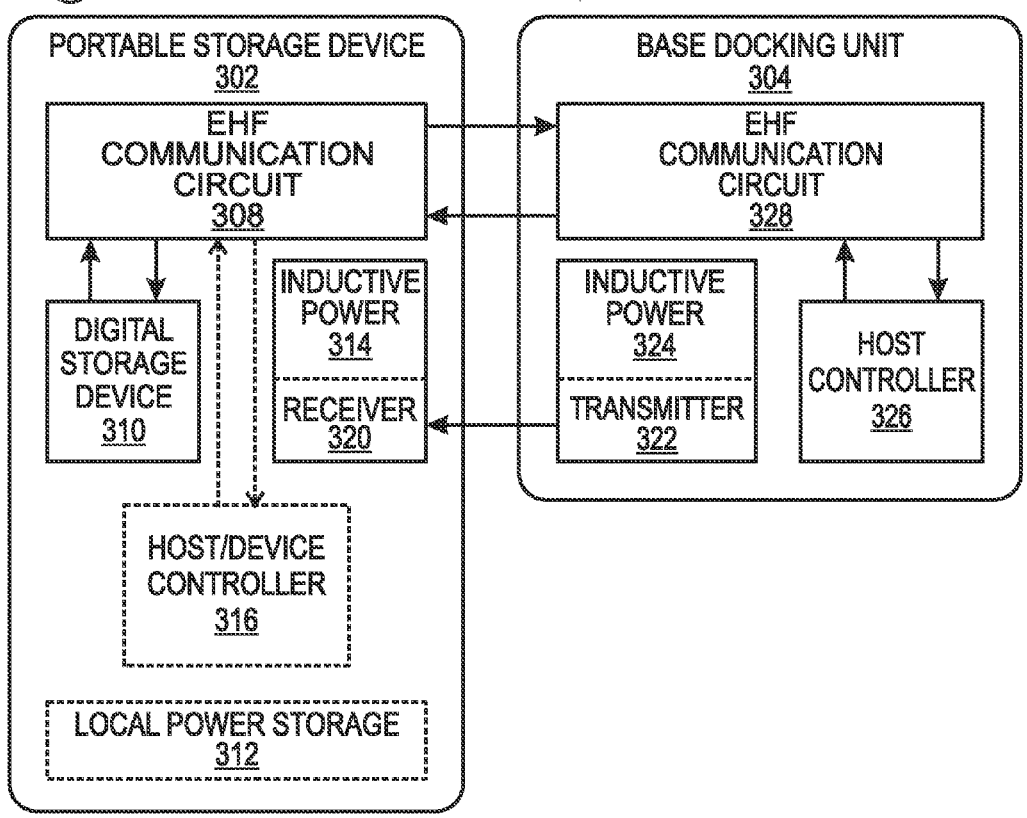
FIG. 11 is a block diagram describing another illustrative two-device wireless docking system.

FIG. 11 is a block diagram depicting an example of a wireless docking system 300, with a portable device 302 having an EHF communication circuit 308, a digital storage device 310, local power storage 312, and an inductive power receiver 314, all similar to portable storage device 202 in wireless docking system 200. A base unit 304 may include an EHF communication circuit 328 and an inductive power source 324, again similar to base unit 204 of system 200. In wireless docking system 300, however, portable device 302 may include a host/device controller 316 and base unit 304 also may include a host controller 326. As described above, this arrangement enables additional functionality. In other examples, two portable devices may be used to accomplish data transfer or copying. In that case, the portable devices may rely on local power storage, such as one or more batteries, rather than inductive power.

FIGS. 12 and 13 depict portions of an illustrative base unit 400 similar to base unit 204 and base unit 304. In this example, a primary coil 402 is disposed on a mounting surface 404, with an IC package 406 being co-located on surface 404 surrounded by primary coil 402 and electrically connected to an EHF communication circuit (not shown). Primary coil 402 and IC package 406 may be encapsulated in plastic or another dielectric, which may take the form of a cylindrical block 408. Block 408 may also take any other suitable shape. A dielectric block having a substantially planar upper surface secures the coil and IC package while also providing a stable surface for secure positioning of portable devices. In other examples, markings may be provided on the upper surface of block 408 and/or form-fitting recesses may be provided to facilitate placement of portable devices such as portable device 202 or 302.

Figure 14:
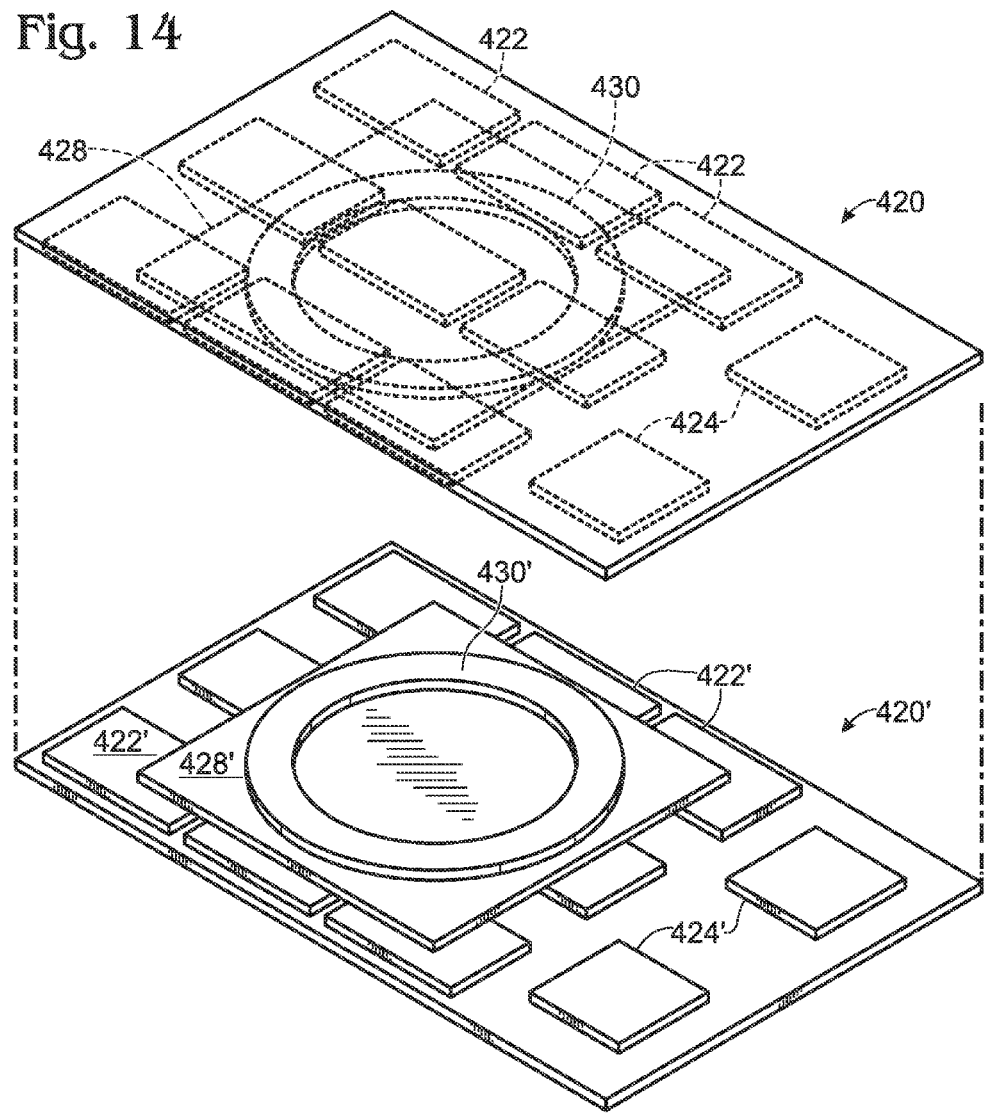
FIG. 14 is an isometric view of two illustrative portable data storage devices in a docking alignment.

FIG. 14 is a perspective view and FIG. 15 is a side view of portions of two illustrative portable data storage devices 420 and 420' in a docking alignment. Devices 420 and 420' are examples similar to portable devices 202 and 302 previously described. As explained above, two data storage-enabled portable devices may be configured to accomplish direct drive-to-drive docking. Here, first device 420 includes data storage units 422 and at least one IC package 424. Second device 420' has similar components, indicated by corresponding primed reference numerals. In this example, two IC packages are used in each device, with one IC package configured as a transmitter and the other configured as a receiver. In other examples, a single IC package may instead be configured as a transceiver.

Power may be provided in each device by a power storage device, such as a battery 426 (426') rechargeable by inductive power receiver 428 (428'), which includes a secondary coil 430 (430'). As described earlier, a docking station or base unit may be used to provide inductive power. When docking from portable device to portable device, components on each device are powered by the respective battery. In other examples, an ultracapacitor or other power storage device may be used.

Figure 16:
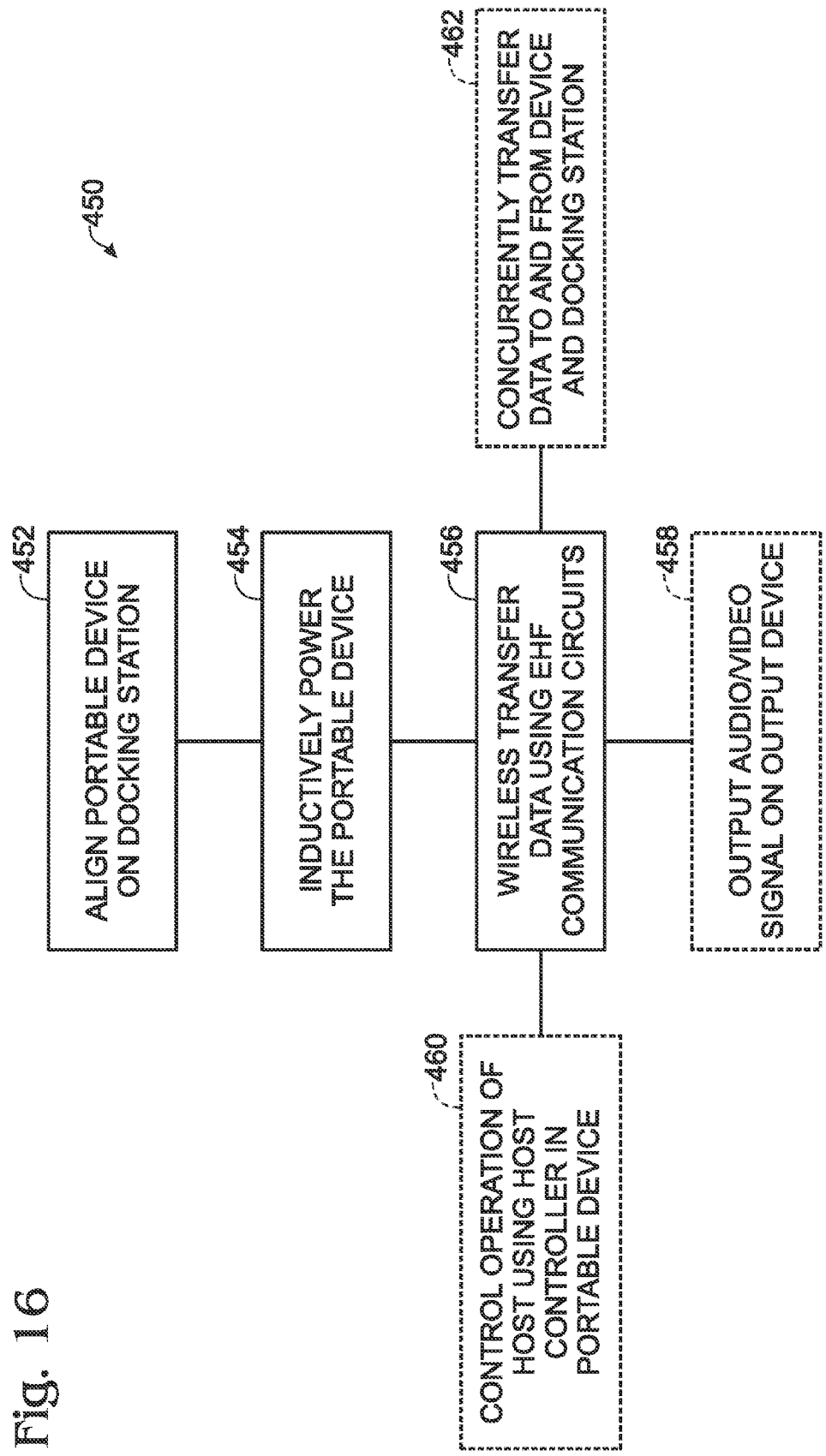
FIG. 16 is a block diagram depicting an illustrative method for charging and synchronizing data in a portable storage device.

FIG. 16 shows a method 450 for charging a portable storage device and synchronizing data between the portable storage device and a host device, base station, or docking station. A step 452 of method 450 may include aligning a portable device such as portable device 202 or 302 on or in mechanical contact with a docking surface of a docking station such as base station 204 or 304 or 400, such that EHF communication units of the respective portable device and base station are in proximity sufficient to allow communication. A step 454 of method 450 may include powering by the inductive power source in the base station the inductive power receiver in the portable device, thereby charging the power storage device and providing power from the power storage device to the data storage unit and EHF IC package in the portable device. Note that the power storage unit may, for example, include a battery or an ultracapacitor.

A step 456 of method 450 may include electromagnetically transferring data between a digital circuit in the base station and one or more data storage units in the portable device by transferring data between the digital circuit and a host EHF communication unit, transferring electromagnetic signals between the host EHF communication unit and the client EHF communication unit, and transferring data between the client EHF communication unit and data storage unit. An optional step 458 of method 450 may include outputting an audio or video signal on an output device operatively coupled to the data storage unit of the portable device. The audio or video signal may be either a digital signal or an analog signal, as appropriate for the output device. Another optional step 460 of method 450 may include controlling operation of the digital circuit in the host/base station by a host controller included in the portable device. Another optional step 462 of method 452 may include two EHF communication units in each of the portable device and the base station, one configured as a transmitter and the other as a receiver, such that information may be concurrently passed in both directions between the portable device and the base station via coupled transmitter/receiver pairs.

A single IC package 10 may be configured as a transceiver 500 by connecting a respective antenna to both the transmitter circuit and the receiver circuit on die 12. FIG. 17 is an overhead view of an illustrative IC package 502 including a die 504 with multiple antennas. Multi-antenna IC package 502 includes both a transmitter circuit and a receiver circuit, and furthermore includes a first antenna 506 operatively connected to the transmitter circuit and a second antenna 508 operatively connected to the receiver circuit. It should be appreciated that the first antenna may instead be connected to the receiver circuit and the second antenna may instead be connected to the transmitter circuit. First antenna 506 and second antenna 508 are examples of transducer 14, and may be held in a spaced relationship with die 504 by encapsulating material 510, in similar fashion to the construction of a single-antenna IC package 10.

First antenna 506 and second antenna 508 may be dipole or folded dipole antennas oriented orthogonally to one another to take advantage of the polarization of the EHF signals being communicated. Orthogonal signals may have reduced interference as compared to the interaction of signals produced by antennas disposed at other angles. This phenomenon results from the fact that a dipole antenna on an EHF comm-link chip produces linearly polarized EM radiation. Accordingly, locating the two antennas on adjacent sides of rectangular die 504 allows exploitation of this aspect of the signals.

While antennas are shown in FIG. 17 as located at ports along either the width or the length of die 504, antennas 606 and 608 may also be located near or at two corners of a die 604, as depicted in the exemplary multi-antenna package 602 of FIG. 18, in which case they are disposed proximate to opposite corners to provide increased spatial separation. However, in order to achieve improved results with antennas in this configuration relative to die 604, it was discovered that a package ground plane 609 may be made larger relative to the die. Additionally, die 604 may be offset relative to ground plane 609 in such a way that the antennas are centered along respective package edges and along respective ground plane sides as shown in FIG. 18.

In other examples, similar to those discussed further below with respect to FIGS. 22-26, EHF antennas associated with IC packages may include other suitable antennas in order to take advantage of other polarization methods. For example, circular or elliptical polarization may be left- or right-handed, resulting in reduced interference between left- and right-hand polarized EM waves regardless of orientation when adjacent antennas are driven with opposing polarizations. Note that circular polarization is a specific case of elliptical polarization. Other suitable antennas producing linear, circular, or elliptical polarization may include spiral, patch, and/or triangular antennas.

While orthogonal orientation may reduce interference between dipole antennas 506 and 508, the quality of communication with a second device benefits from some lateral spatial separation of the two antennas in order to further reduce interference when the two devices communicate concurrently. This distance may be varied by changing the size of the die and thereby the associated spacing of the antennas. Specifically, with the antennas disposed near the middle of respective sides of the die, a larger die results in greater separation between the antennas. Spacing may also be altered by adjusting the positions of the antennas along the sides of the die, as in FIG. 18.

It was also discovered that mounting multi-antenna die 504 on a substrate 512 in the chip package 502 produces a radiation-propagation path between the first and second antennas through the substrate itself. For example, with the antennas positioned on adjacent sides of the die, a propagation path extending through the substrate around the corner of the die between the antennas is produced. In order to reduce the strength of the radiation propagating along the propagation path through the substrate, an EHF blocking structure 610 may be constructed in the propagation path.

Figure 20:
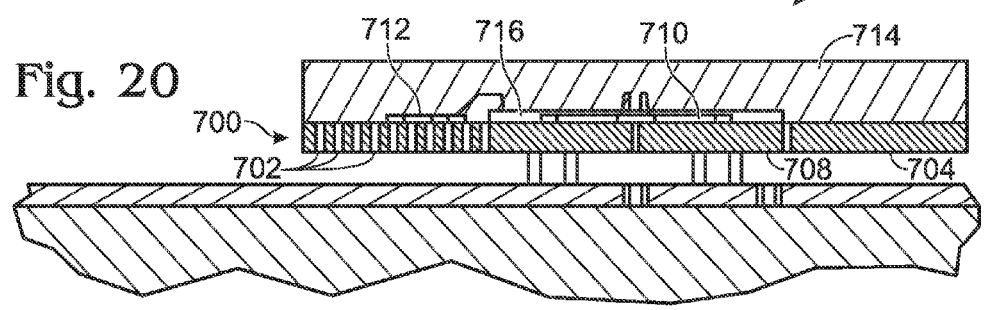
FIG. 20 is a cross-sectional side view of the IC package and via fence of FIG. 18.
Figure 19:
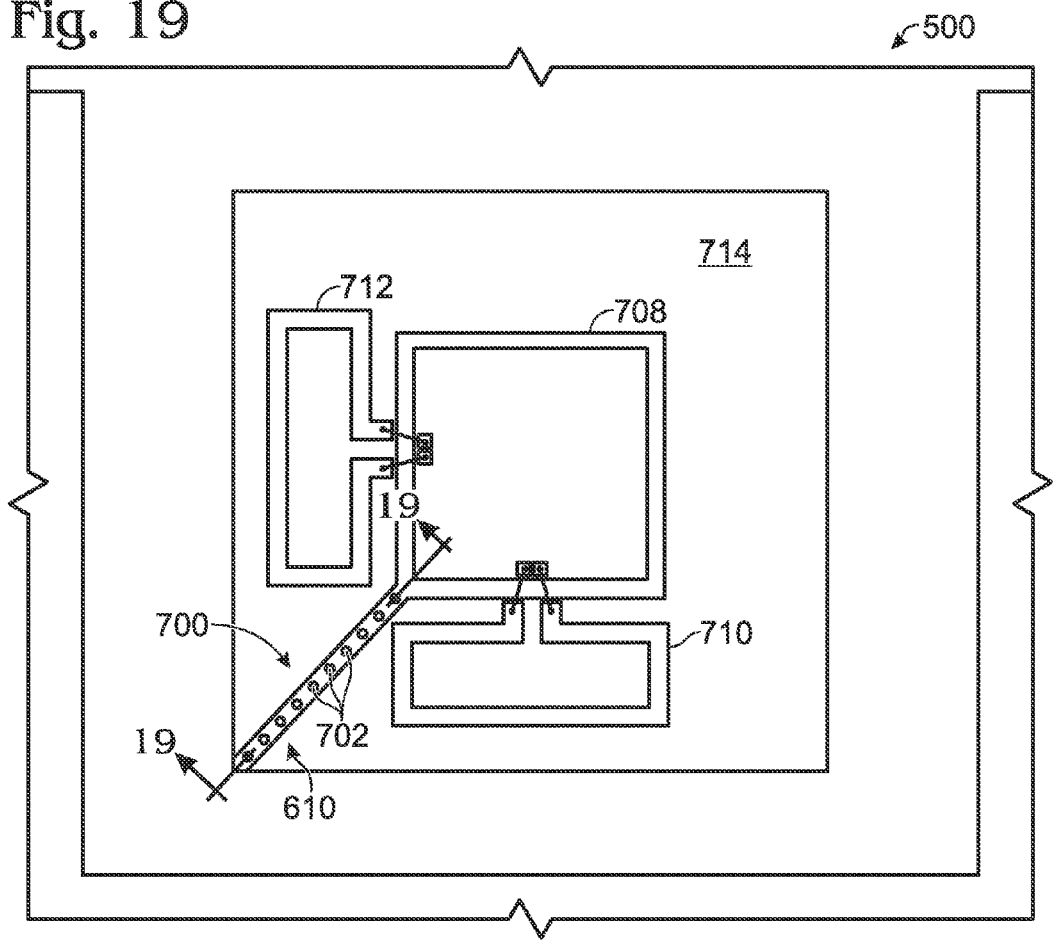
FIG. 19 is an overhead view of an illustrative multi-antenna IC package with an illustrative via fence.
Figure 21:
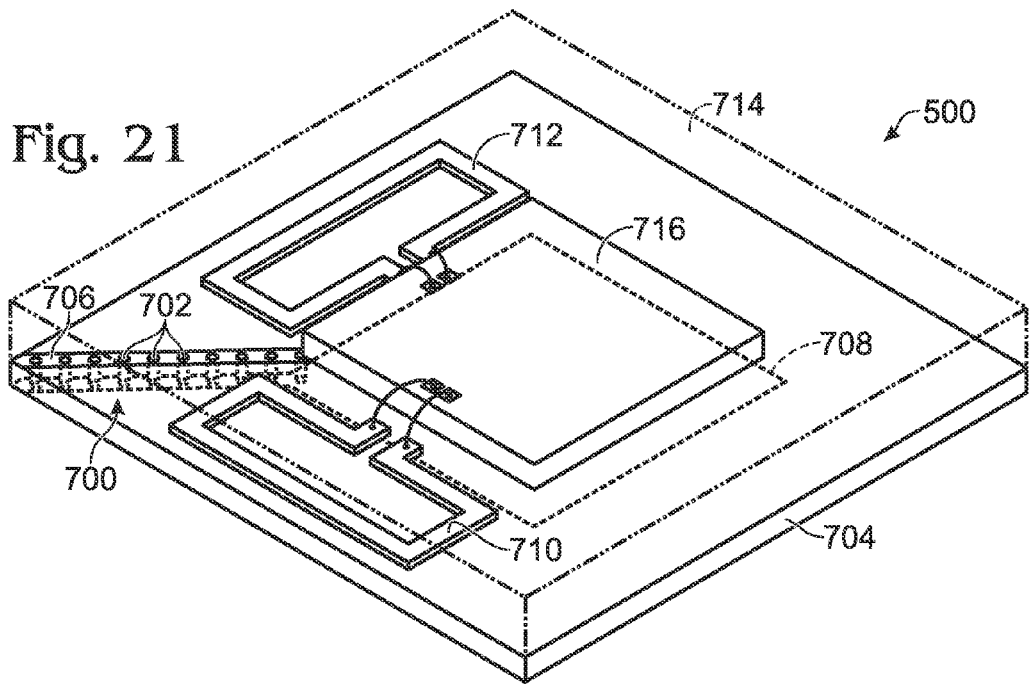
FIG. 21 is an isometric side view of an illustrative IC package with a via fence.

An example of such a structure is depicted in FIGS. 19-21. As depicted, a via fence 700 may be created by forming plated vias 702 through substrate 704 in a line across the propagation path between antennas 710 and 712 of an IC package 714 and die 716. A strip of conductive material 706 may be laid down on an upper surface of the substrate, and the vias 702 may electrically connect conductive strip 706 and an underlying package ground plane 708. In some examples, a plurality of vias 702 may be formed as closely spaced as practicable, and preferably at a spacing well below the wavelength of a circuit operating frequency.

Figure 22:
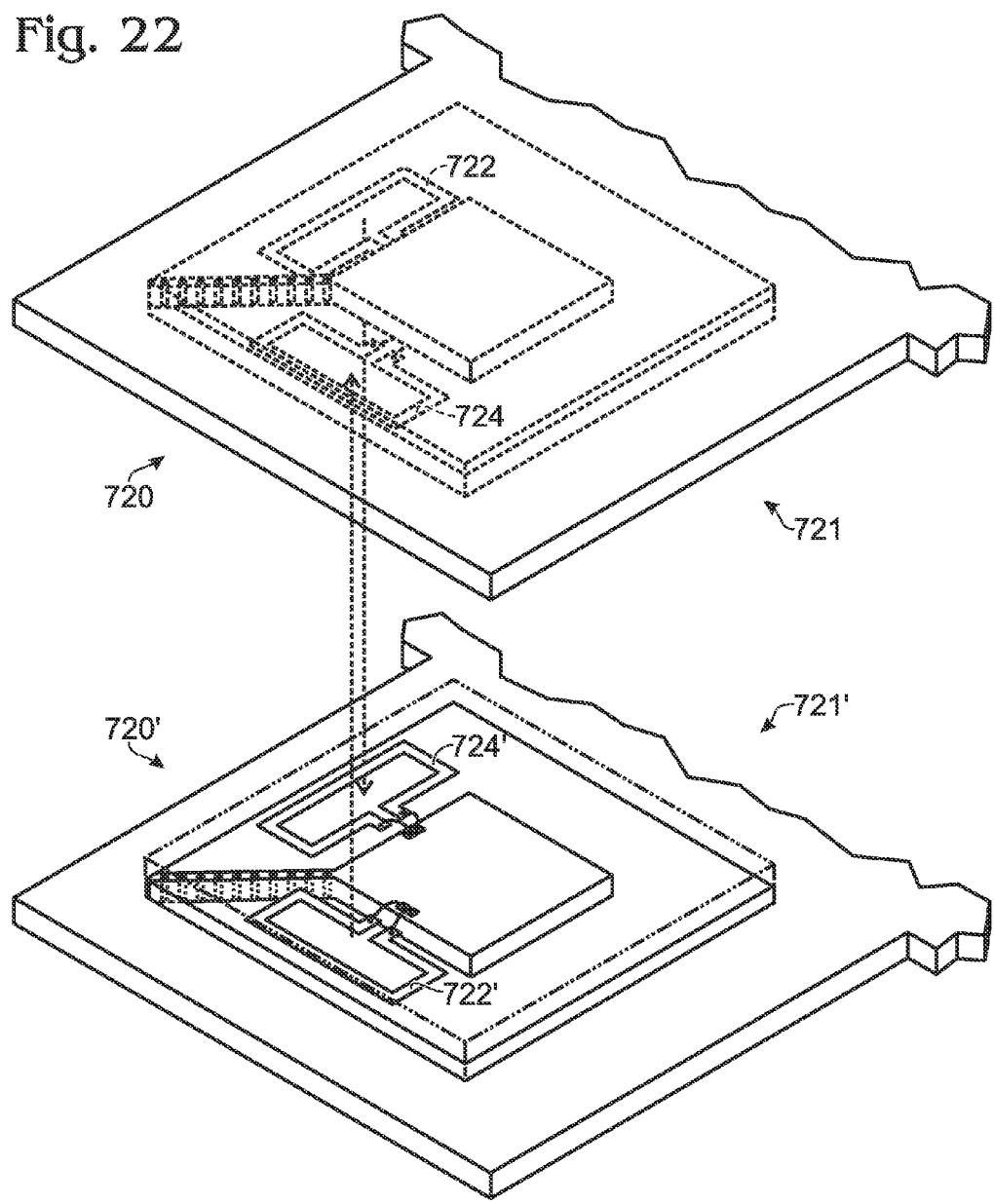
FIG. 22 shows two illustrative multi-antenna IC packages disposed one above the other.

FIG. 22 shows first and second multi-antenna IC packages 720 and 720' mounted respectively on exemplary devices 721 and 721', arranged one over the other to show how the packages may be configured to enable communication between devices or systems. As shown in FIG. 22, the packages may be configured such that a transmitter antenna 722 on device 721 is aligned with a receiver antenna 724' on device 721', and a receiver antenna 724 on device 721 is aligned with a transmitter antenna 722' on device 721' when the two devices are in lateral and proximal alignment. This arrangement may allow simultaneous transmission and reception between the two devices, with the packages acting as transceivers.

Various other arrangements have been discovered in which multiple antennas may be employed for simultaneous transmission and/or reception on one or more communication channels. Examples of these arrangements are now described in further detail.

FIG. 23 shows an example of two discrete IC packages with associated antennas mounted on a common PCB. Specifically, FIG. 23 illustrates a PCB 730 having mounted thereon discrete IC packages 732 and 734 with antennas 736 and 738 that are disposed orthogonally. In the example of FIG. 23, and in the examples of FIGS. 23-26 generally, the antennas of each chip may be dipole or folded dipole, and therefore linearly polarized, or may instead be antennas having other polarizations such as circular or elliptical.

Increased densities of larger N×M arrays of IC packages or chips may also be achieved, such as a 5×5 array 740 depicted in FIG. 24, by taking advantage of the polarization characteristics of emitted EHF signals. In this example, the EHF signal of each antenna 742 has a linear polarization direction vector pointing from the antenna directly away from the chip. A plurality of IC packages 744 may be arranged such that no two adjacent IC packages 744 have their polarization direction vectors aligned with each other, as indicated by the different orientations of antennas 742. For example, each IC package 744 in FIG. 24 has a polarization direction vector oriented at 90-degrees from the polarization direction vector of each adjacent IC package 744. Another corresponding array of IC packages with corresponding orientations (not shown) may be disposed on another layer of a stacked architecture to provide inter-layer communications, also with adjacent antennas having different polarization characteristics.

Figure 26:
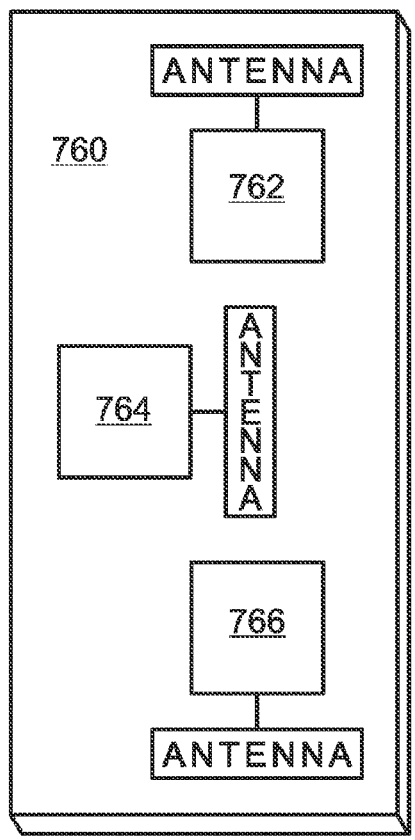
Figure 27:
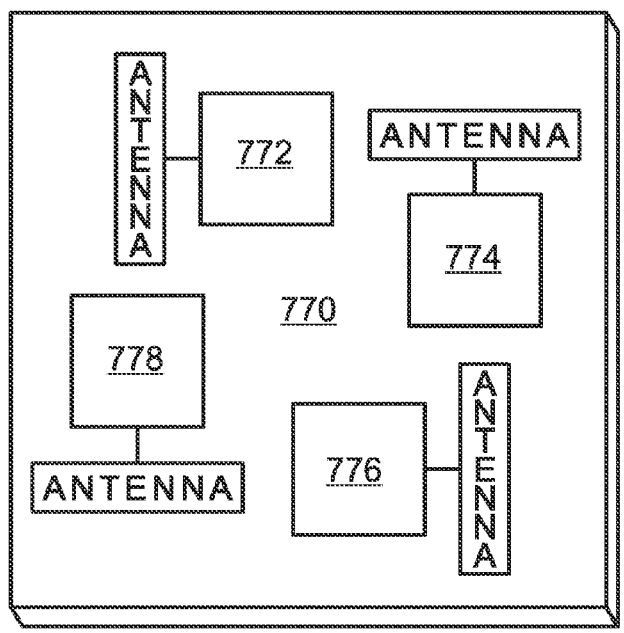

Rather than arranging multiple single-antenna packages on a mounting surface, it is also possible to achieve multi-channel communications by placing multiple single-antenna dies or chips inside a single common package encapsulant. FIGS. 25-27 show examples of these types of devices.

FIGS. 25-27 illustrate various arrangements of multiple single-antenna chips in a common package encapsulant. These arrangements may be used to allow simultaneous transmission and reception on one or more channels. As shown in the drawings, antennas are either oriented orthogonally from other proximal antennas or are in a parallel orientation and spaced apart within a given package in order to take advantage of the linear polarization effect described above, in addition to spatial separation. As mentioned above, these embodiments may use different elliptical polarization in adjacent antennas to achieve similar isolation between adjacent communication channels.

Specifically, FIG. 25 illustrates an IC package 750 having adjacent discrete chips 752 and 754 with antennas that are disposed orthogonally.

FIG. 26 illustrates an elongate chip package 760 having discrete chips 762, 764, 766, with chip 764 disposed adjacent to and between chips 762 and 766. The antenna of chip 764 is disposed orthogonally to the antennas of chips 762 and 766, the antennas of which are accordingly disposed parallel to each other in this two dimensional array. In a three-dimensional array, all three antennas may be positioned orthogonally to each other.

FIG. 27 illustrates an IC package 770 having discrete chips 772, 774, 776, 778, with the chips distributed around the periphery of the package. More specifically, the package is rectangular and each chip is disposed proximate a package corner. Each chip is adjacent to two other chips, such as chips 774 and 778, and disposed opposite the third chip, such as the antenna of chip 772 being parallel to but spaced from chip 776 compared to the spacing between the antennas of adjacent chips 772 and 774. The antenna of each chip, such as chip 772, is orthogonal to the antennas of the two adjacent chips, such as chips 774 and 778, and is parallel to but spaced from the antenna of the opposite chip, such as chip 776. In a three-dimensional configuration, the antennas of opposite chips may also be orthogonal in addition to being orthogonal to the antennas of the adjacent chips.

As mentioned above, circular- and elliptically-polarized signals may be left- or right-handed. Interference between a left-handed and a right-handed signal is reduced regardless of orientation of the antennas compared to signals having the same polarization. However, spatial separation may still reduce interference. Accordingly, the examples of FIG. 23-27 may include antenna types that are linear, elliptical, or circular in their polarization. For linear-polarized antennas, the spatial separation as well as the orthogonal or opposite polarization shown in the drawings may reduce signal interference. For circular- or elliptically-polarized antennas, orthogonal orientation is not a factor in signal interference, but spacing remains a factor. Accordingly, the arrangements shown in FIGS. 23-27 are suitable for a variety of antenna types.

Figure 28:
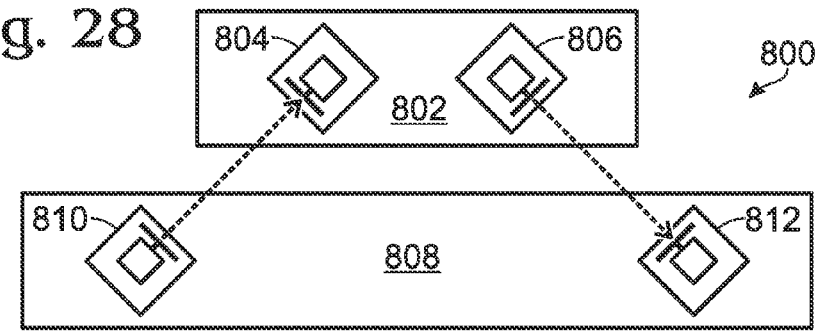
FIG. 28 shows two illustrative devices each having two IC packages in communication with each other.
Figure 29:
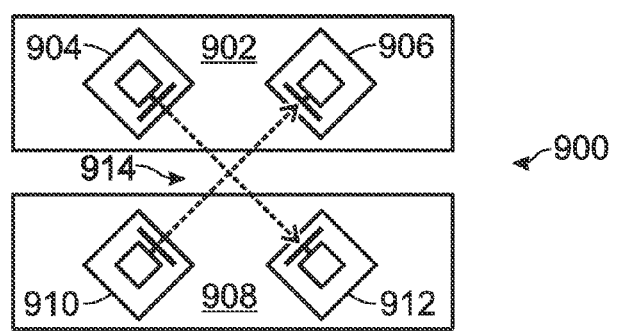
FIG. 29 shows another example of two devices each having two IC packages in communication with each other.

FIGS. 28 and 29 depict two specific embodiments of systems including a two-chip device or package in communication with another two-chip device or package. In the examples of FIGS. 28 and 29, all IC packages have dipole or folded dipole antennas. As shown in the example of FIG. 28, a communication system 800 includes a first device 802 having two mounted single-chip, single-antenna IC packages 804 and 806, and a second device 808 having two mounted single-chip, single-antenna IC packages 810 and 812.

In device 802, the antennas of packages 804 and 806 are each disposed orthogonally and mutually spaced away from the other along a common side of the device. The antennas of IC packages 810 and 812 are also orthogonal and disposed apart along a common side of device 808 so that each antenna is aligned with and proximate an antenna of one of IC packages 804 and 806 when the respective common sides of devices 802 and 808 are disposed in facing relationship, as depicted.

Specifically, when configured and positioned as shown, the antenna of IC package 804 is directed toward and proximate to the antenna of IC package 810, and the antenna of IC package 806 is directed toward and proximate to the antenna of IC package 812. Described in another way, if an antenna end of each chip is defined as the end including the antenna, and an opposite end is defined as the end opposite the antenna end, then orienting two IC packages 804 and 806 of device 802 with their opposite ends closer together as in FIG. 28 results in the antenna ends being directed away from each other into respective spaced-apart radiation regions. Second device 808 then has two corresponding packages 810 and 812 spaced significantly farther apart so that when the common sides of the two devices are positioned facing each other, the associated antenna ends of the device 804 packages are facing the corresponding antenna ends of the device 802 packages. More specifically, the antenna end of package 804 faces the antenna end of package 810 and the antenna end of package 806 faces the antenna end of package 812.

In other examples of system 800, first and second devices 802 and 808 are instead IC packages, and IC packages 804, 806, 808, and 810 are chips with respective antennas. A similar alternative is possible regarding the following example.

A communication system 900 depicted in FIG. 29 includes a first two-chip device 902 having IC packages 904 and 906, and a second two-chip device 908 having IC packages 910 and 912. In this example, the antennas of the two packages are orthogonal to each other and the antenna ends of the packages are disposed adjacent to each other along a common side of the respective device. The respective opposite ends of the IC packages on each device are spaced farther apart than the respective antenna ends.

When devices 902 and 908 are placed with the common sides in proximity, the four antennas face a common radiation region 914 disposed between the respective antennas with opposite antennas, with the antennas of IC packages 904 and 910 and the antennas of IC packages 906 and 912, being parallel. Each antenna is also orthogonal to the two adjacent antennas. For example, the antenna of IC package 904 is orthogonal to the antennas of IC packages 906 and 910.

This arrangement allows two substantially identical devices to communicate as shown in FIG. 29, by taking advantage of the linear polarization effect. Although the paths of radiation intersect in the radiation region, interference is minimized by the previously described polarization differences.

Accordingly, a system as described above for scalable, high-bandwidth connectivity may include one or more of the following examples.

In one example, an electronic device may include a dielectric client substrate, a first data storage unit mounted to the client substrate for storing digital information, and a first client EHF communication unit having a first antenna. The first client communication unit mounted to the client substrate may be in communication with the first data storage unit. This may facilitate converting between an EHF electromagnetic signal containing digital information conducted by the first antenna and a data signal conducted by the first data-storage circuit.

A second data storage unit may be mounted to the client substrate and in communication with the first client EHF communication unit. The first and second data storage units may be formed as integrated circuits.

A second data storage unit may be mounted to the client substrate. The electronic device may also include a second client EHF communication unit mounted to the client substrate in communication with the second data storage unit and having a second antenna.

The first client EHF communication unit may be configured as a transceiver.

The electronic device may also include a plurality of data storage units including the first data storage unit and a plurality of client EHF communication units including the first client EHF communication unit. The pluralities of data storage units and client communications units may be mounted to the client substrate and distributed on a major surface of the client substrate spaced from a perimeter of the major surface.

The client EHF communication units may transmit or receive predominantly electromagnetic radiation having a polarization characteristic and the communication units may be oriented with adjacent communication units having different respective polarization characteristics.

The plurality of client EHF communication units may be distributed in a two dimensional pattern, there being at least one client EHF communication unit having an adjacent client EHF communication unit disposed in each of two non-parallel directions.

The plurality of client EHF communication units may be distributed in an N×M array, where N and M are integers greater than 1.

A data storage system may include the electronic device and a host device. The host device may include a first host EHF communication unit for communicating the EHF electromagnetic signal with the first client EHF communication unit in order to convey digital information between the host device and the electronic device.

The electronic device may further include a plurality of client EHF communication units including the first client EHF communication unit, and a data storage unit associated with and operatively coupled to one of the plurality of client EHF communication units. The data storage unit and client EHF communication units may be mounted to the client substrate and distributed on a major surface of the client substrate spaced from a perimeter of the major surface of the client substrate. The host device may also have a dielectric host substrate and a plurality of host EHF communication units including the first host EHF communication unit, with each host EHF communication unit corresponding to a respective one of the plurality of client EHF communication units. The host EHF communication units may be mounted to and distributed on a major surface of the host substrate in positions appropriate for the host communications units to align sufficiently with corresponding respective ones of the plurality of client EHF communication units when the major surface of the client substrate is positioned facing the major surface of the host substrate. This may facilitate communication between the host EHF communication units and the client EHF communication units.

The client EHF communication units and the host EHF communication units may transmit or receive electromagnetic radiation having a polarization characteristic and the communication units may be oriented with adjacent communication units having different polarization characteristics, with each pair of aligned host and client EHF communication units having the same polarization characteristic.

In another example, an IC package assembly may have first, second, and intermediate dielectric substrate portions. A first EHF comm-link chip may be mounted to the first dielectric substrate portion, with a first antenna mounted to the first dielectric substrate portion and operatively coupled to the first EHF comm-link chip. A second EHF comm-link chip may be mounted to the second dielectric substrate portion, and a second antenna mounted to the second substrate portion and operatively coupled to the second EHF comm-link chip. The first EHF comm-link chip and the first antenna may be configured as a transmitter. The second EHF comm-link chip and the second antenna may be configured as a receiver. The second antenna may be disposed relative to the first antenna to receive radiation transmitted by the first antenna. The intermediate dielectric substrate portion may extend between the first and second antennas.

The IC package may also include a conductive plane having an aperture, the conductive plane being disposed between the first and second dielectric substrate portions. The intermediate dielectric portion may be disposed in the aperture.

In another example, a data device for electromagnetic communication with a host may include at least one data storage unit and at least one EHF communication unit in communication with the at least one data storage unit. The EHF communication unit may be constructed to communicate with the host via electromagnetic communication. The at least one data storage unit and the at least one EHF communication unit may be coupled to an expanse.

The data device may also include a covering of dielectric material that seals the at least one data storage unit, the at least one EHF communication unit, and the expanse.

The expanse may include a printed circuit board (PCB), and the at least one EHF communication unit may be coupled to the PCB.

The data device may also include plural data storage units formed as integrated circuits (ICs) mounted on the PCB, and plural EHF communication units also mounted on the PCB relative to the data storage units. The data storage units and EHF communication units may be arranged on the PCB in a preselected array, and the EHF communication units may each be positioned on the PCB in a preselected orientation in which signals generated by each EHF communication unit have a polarization characteristic that is oriented differently from a polarization characteristic of adjacent EHF communication units.

In a further example, a data card for electromagnetic communication with a host may comprise a card body that includes an outer surface and an internal expanse. The internal expanse may include plural data storage units. The body may accommodate communication with the host via electromagnetic communication. The internal expanse may also include a plurality of EHF communication units that are each in communication with at least one of the data storage units. The internal expanse may include a printed circuit board (PCB), and the data storage units and the EHF communication units may be coupled to the PCB. The EHF communication units may be located on the PCB relative to the data storage units. The EHF communication units and data storage units may also be arranged on the PCB in a preselected array, with EHF communication units each positioned on the PCB in a preselected orientation in which signals generated by each EHF communication unit have a polarization characteristic that is different from that of adjacent EHF communication units.

In another example, a system for communicating EHF electromagnetic signals between a first and a second communication apparatus may include a first communication apparatus. The first communication apparatus may include a printed circuit board (PCB) and a first EHF communication unit disposed on the PCB. The first EHF communication unit may include a chip having an integrated circuit (IC), an antenna in communication with the IC, and insulating material holding the IC and antenna in fixed positions on the PCB. The IC may be operatively coupled to the antenna and may contain at least one of a transmitter circuit that transforms a baseband data signal into an EHF electrical signal and conducts the transformed EHF electrical signal to the antenna for transmission as an EHF electromagnetic signal encoded with data, and a receiver circuit that receives from the antenna an EHF electrical signal received by the antenna as an EHF electromagnetic signal encoded with data and transforms the received EHF electrical signal into a baseband data signal. The first communication apparatus may also include a data storage unit supported by the PCB for storing data and communicating the baseband data signal with the EHF communication unit. The first communication apparatus may also include an inductive power receiver for converting received inductive energy into power for operating the first EHF communication unit and data storage unit.

The second communication apparatus may include a power source configured to produce the inductive energy for the inductive power receiver, and a second EHF communication unit for communicating the EHF electromagnetic signal with the first EHF communication unit.

The first communication apparatus may also include a power storage device coupled to the inductive power receiver for storing power received from the inductive power receiver and applying the stored power to the first EHF communication unit and the data storage unit. The first communication apparatus may also include a portable data storage device and the second communication apparatus may also include a docking station for supporting the first communication apparatus with the first EHF communication unit in proximity to the second EHF communication unit.

The first EHF communication unit may also include a lead frame coupling the IC to conductors printed on the PCB, and the IC may include a ground plane operatively connected to a first conductor element in the lead frame. The insulating material of the first EHF communication unit may encapsulate the IC, the lead frame, and the antenna to comprise an IC package.

In another example, a system for wirelessly transferring data and power may include a client communication apparatus. The client communication apparatus may include a client data circuit, a client EHF communication unit, and a client inductive power coil. The client data circuit may be configured for processing data. The client EHF communication unit may be coupled to the client data circuit in order to communicate data in a first data signal conducted between the client EHF communication unit and the client data circuit. The client inductive power coil may convert received inductive energy into power for operating the client EHF communication unit and the client data circuit. The system may also include a host communication apparatus including a host data circuit, a host EHF communication unit, and a power source. The host data circuit may process data. The host EHF communication unit may be coupled to the host data circuit in order to communicate data in a second data signal conducted between the host EHF electromagnetic communication unit and the host data circuit. The host EHF communication unit may communicate electromagnetically with the client EHF communication unit. The power source may provide inductive energy to the client inductive power coil when the client communication apparatus is positioned in proximity to the host communication apparatus.

The client communication apparatus may further include a power storage device coupled to the power coil for storing power received by the power coil and may apply the stored power to the client EHF comm.-link chip assembly and the client data circuit.

The host communication apparatus may further include a host controller in communication with the host EHF communication unit for controlling operation of the host EHF comm-link chip.

The power source may include a host inductive power coil for generating the inductive energy. The host communication apparatus may also include a plastic encapsulant holding the host inductive power coil in a fixed position relative to the host EHF communication unit.

An exemplary method of charging and synchronizing data in a portable device containing data storage may include providing a portable device including a data storage unit, a first EHF communication unit in communication with the data storage unit, a power storage device, and an inductive power receiver configured to provide power to the power storage device. A docking station may also be provided, including a housing having a size and shape for supporting the portable storage device, a second EHF communication unit, a digital circuit, and a power source. The portable device may be placed on the docking station with the first EHF communication unit in proximity with the second EHF communication unit and the power source in proximity with the inductive power receiver. Placing the devices in proximity may power by the power source the inductive power receiver in the portable device, thereby charging the power storage device and providing power from the power storage device to the data storage unit and the first EHF communication unit. Data may be electromagnetically transferred between the digital circuit and the data storage unit by transferring data between the digital circuit and the first EHF communication unit, transferring electromagnetic signals between the first EHF communication unit and the second EHF communication unit, and transferring data between the second EHF communication unit and the data storage unit.

An analog or digital audio or video signal may be output on an output device operatively coupled to the data storage unit.

Operation of the digital circuit may be controlled by a host controller included in the portable device.

The power storage device may be a rechargeable battery or a capacitor that may be charged by powering the inductive power receiver using the power source.

The portable device may include a third EHF communication unit and the docking station may include a fourth EHF communication unit. Electromagnetic radiation may be transmitted from the first EHF communication unit to the second EHF communication unit and concurrently transmitted from the fourth EHF communication unit to the third EHF communication unit.

In another example, an EHF communication unit may include a die having a transmitter circuit and a receiver circuit. A first antenna may be operatively connected to the transmitter circuit. A second antenna may be operatively connected to the receiver circuit. Dielectric material may encapsulate and hold in relative spaced relationship the first antenna, the second antenna, and the die. The first and second antennas may transmit or receive electromagnetic radiation having different respective polarization characteristics.

The first and second antennas may transmit or receive linearly polarized electromagnetic radiation and a first polarization direction vector of the first antenna may be oriented orthogonally to a second polarization direction vector of the second antenna.

The first antenna may transmit one of right-handed and left-handed polarized electromagnetic radiation, and the second antenna may receive the other of right-handed and left-handed polarized electromagnetic radiation.

The die may have a length and a width. The first antenna may be located at a first port disposed at a point along the length, and the second antenna may be located at a second port disposed at a point along the width.

The die may have a plurality of corners. The first antenna may be located proximate to one corner, and the second antenna may be located proximate to another corner.

The length and width of the chip may each be about 1.0 mm to about 2.0 mm.

The communication unit may also include a dielectric substrate and an EHF radiation-blocking structure disposed in the substrate. The EHF electromagnetic comm-link chip package may be mounted on the substrate with the first and second antennas being disposed at spaced-apart positions on the substrate. The substrate may extend between the first antenna and the second antenna, defining a radiation propagation path. The EHF radiation-blocking structure may be disposed in the substrate and extend at least partly across the propagation path.

The communication unit may also include a ground plane attached to the substrate. The EHF radiation-blocking structure may include a via fence having a strip of conductive material on a surface of the substrate and a plurality of spaced-apart vias formed along a length of the strip of conductive material. The vias may electrically connect the strip of conductive material to the ground plane.

The plurality of vias may be spaced apart at intervals less than a wavelength of a device operating frequency.

In a further example, a system may include first and second communication devices. The first communication device may include a first EHF electromagnetic comm-link chip having a first antenna configured as a transmitter and a second antenna configured as a receiver. The second communication device may include a second EHF comm-link chip having a third antenna configured as a transmitter and a fourth antenna configured as a receiver. The first antenna may be configured to transmit and the fourth antenna may be configured to receive electromagnetic radiation having a first polarization characteristic. The third antenna may be configured to transmit and the second antenna may be configured to receive electromagnetic radiation having a second polarization characteristic that is different than the first polarization characteristic. The first device and the second device may be configured so that when the first device is placed proximate to and in lateral alignment with the second device, the first antenna is aligned with and facing the fourth antenna and the second antenna is aligned with and facing the third antenna.

In another example, a chip assembly may have a first EHF comm-link chip, a first antenna operatively coupled to the first EHF comm-link chip, a second EHF comm-link chip, a second antenna operatively coupled to the second EHF comm-link chip, and a dielectric substrate holding the first antenna in a spaced relationship relative to the second antenna. The first EHF comm-link chip and first antenna may be configured as a transmitter that transmits electromagnetic radiation having a first polarization characteristic. The second EHF comm-link chip and the second antenna may be configured as a receiver that receives electromagnetic radiation having a second polarization characteristic that is different than the first polarization characteristic.

The first antenna may transmit one of right-handed and left-handed elliptically polarized electromagnetic radiation, and the second antenna may receive the other of right-handed and left-handed elliptically polarized electromagnetic radiation.

The first antenna may transmit and the second antenna may receive linearly polarized electromagnetic radiation. The first antenna may be oriented to produce electromagnetic radiation that is orthogonal to radiation produced by the second antenna.

Each EHF comm-link chip may also include a first end to which the associated antenna is connected and a second end opposite the first end; wherein the respective second ends are spaced farther apart than the respective first ends. Electromagnetic radiation transmitted from the first antenna may extend at least partially through a common region, and electromagnetic radiation received by the second antenna may also extend at least partially through the common region.

The first antenna may direct transmitted radiation along a first path that is transverse to a second path of radiation received by the second antenna. The first path of radiation may intersect the second path of radiation. Alternatively, the first path of radiation may not intersect the second path of radiation.

INDUSTRIAL APPLICABILITY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

We claim:

1. A first electronic device for electromagnetic communication with a second electronic device, the second electronic device having a surface and plural Extremely High Frequency (EHF) communication units distributed on the surface, the first electronic device comprising:
    a dielectric substrate having a major surface;
    at least a first electronic component mounted on the first substrate, for processing digital information;
    plural first EHF communication units, each having an antenna and being mounted on the dielectric substrate, and each for transmitting and or receiving respective EHF electromagnetic signals and converting between corresponding baseband signals and EHF electromagnetic signals
    wherein at least one of the first EHF communication units is in communication with the first electronic component to convert between a first EHF electromagnetic signal containing digital information conducted by the antenna of the at least one first EHF communication unit, and a first data signal conducted by the first electronic component; and
    wherein the plural first EHF communication units are distributed over the major surface in a configuration that is effective for the plural first EHF communications units to align with corresponding ones of the plural EHF communication units of the second electronic device, the alignment forming pairs of aligned EHF communication units when the major surface is positioned facing the surface of the second electronic device to enable communication between the first EHF communication units and the EHF communication units of the second electronic device, each pair of aligned EHF communication units forming a communication channel.

2. The first electronic device of claim 1, further comprising a second electronic component mounted to the first substrate and in communication with the one first EHF communication unit further for converting between the first EHF electromagnetic signal containing digital information conducted by the first antenna and a second data signal conducted by the second electronic component, the first and second electronic components being formed as integrated circuits.

3. The first electronic device of claim 1, further comprising a second electronic component mounted to the first substrate, and another first EHF communication unit of the plurality of first EHF communication units, the other first EHF communication unit having a second antenna and being in communication with the second electronic component.

4. The first electronic device of claim 1, wherein the one first EHF communication unit is configured as a transceiver.

5. The first electronic device of claim 1, further comprising a plurality of electronic components including the first electronic component, the plurality of electronic components being mounted to the first substrate and distributed on the first major surface.

6. The first electronic device of claim 5, wherein the first EHF communication units transmit or receive predominantly electromagnetic radiation having a polarization characteristic and the first EHF communication units are oriented with adjacent first EHF communication units having different respective polarization characteristics.

7. The first electronic device of claim 5, wherein the plurality of first EHF communication units are distributed in a two dimensional pattern, with at least the one first EHF communication unit having an adjacent first EHF communication unit disposed in each of two non-parallel directions.

8. The first electronic device of claim 7, wherein the plurality of first EHF communication units are distributed in an N×M array, where N and M are integers greater than 1.

9. The electronic device of claim 1, wherein the plurality of client EHF communication units are spaced from a perimeter of the major surface of the client substrate.

10. A system comprising the first electronic device and the second electronic device of claim 1.

11. The system of claim 10, wherein the first EHF communication units and the EHF communication units of the second electronic device transmit and or receive electromagnetic radiation having a polarization characteristic and the first EHF communication units and the EHF communication units of the second electronic device are oriented with adjacent respective first EHF communication units and the EHF communication units of the second electronic device having different polarization characteristics, with each pair of aligned EHF communication units having the same polarization characteristic.

12. A first data device for electromagnetic communication with a second data device, the second data device having a surface and plural Extremely High Frequency (EHF) communication units distributed on the surface, the first data device comprising at least one data storage unit; plural first EHF communications units constructed to communicate with the second data device via electromagnetic communication, with at least one first EHF communication unit in communication with the at least one data storage unit; and an expanse to which the at least one data storage unit and the plural first EHF communication units are coupled, the plural first EHF communication units being distributed on the expanse in a configuration appropriate for the plural first EHF communications units to align sufficiently with corresponding respective ones of the plural EHF communication units of the second data device to form pairs of aligned EHF communication units when the expanse is positioned facing the major surface for communicating between the first EHF communication units and the EHF communication units of the second data device, each pair of aligned EHF communication units forming a respective communication channel.

13. The data device of claim 12, further including a covering of dielectric material that seals the at least one data storage unit, the plurality of first EHF communication units, and the expanse.

14. The data device of claim 13, wherein the expanse includes a printed circuit board (PCB), and the plurality of first EHF communication units are coupled to the PCB.

15. The data device of claim 14, including plural data storage units formed as integrated circuits (ICs) mounted on the PCB, the plurality of first EHF communication units also being mounted on the PCB relative to the data storage units.

16. The data device of claim 15, wherein the data storage units and first EHF communication units are arranged on the PCB in a preselected array corresponding to the second configuration, and wherein the first EHF communication units are each positioned on the PCB in a preselected orientation in which signals generated by each first EHF communication unit have a polarization characteristic that is oriented differently from that of adjacent first EHF communication units.

17. The data device of claim 12, wherein the expanse is a printed circuit board (PCB), and the plurality of first EHF communication units are coupled to the PCB.

18. The data device of claim 17, including plural data storage units formed as integrated circuits (ICs) mounted on the PCB, the plurality of first EHF communication units also being mounted on the PCB relative to the data storage units.

19. The data device of claim 18, wherein the data storage units and first EHF communication units are arranged on the PCB in a preselected array, and wherein the first EHF communication units are each positioned on the PCB in a preselected orientation in which signals generated by each first EHF communication unit have a polarization characteristic that is oriented differently from a polarization characteristic of adjacent EHF communication units.

20. A data card for electromagnetic communication with a host, the host having a surface and plural Extremely High Frequency (EHF) communication units distributed on the surface, the data card comprising a card body that includes an outer surface and an internal expanse; wherein the internal expanse includes plural data storage units and plural first EHF communication units that are each in communication with at least one of the data storage units; and wherein the plural first EHF communication units are distributed on the expanse in a configuration appropriate for the plural first EHF communications units to align sufficiently with corresponding respective ones of the plural EHF communication units of the host to form pairs of aligned EHF communication units when the expanse is positioned facing the surface for accommodating communication between the first EHF communication units and the EHF communication units of the host via electromagnetic communication, each pair of aligned EHF communication units forming a respective communication channel.

21. The data card of claim 20, wherein the internal expanse includes a printed circuit board (PCB), and the data storage units and the first EHF communication units are coupled to the PCB.

22. The data card of claim 21, wherein the first EHF communication units are located on the PCB relative to the data storage units.

23. The data card of claim 22, wherein the EHF communication units and data storage units are arranged on the PCB in a preselected array, and wherein the EHF communication units are each positioned on the PCB in a preselected orientation in which signals generated by each EHF communication unit have a polarization characteristic that is different from that of adjacent EHF communication units.

* * * * *